(12) United States Patent
Fitzgerald

(10) Patent No.: US 7,256,142 B2
(45) Date of Patent: *Aug. 14, 2007

(54) RELAXED SIGE PLATFORM FOR HIGH SPEED CMOS ELECTRONICS AND HIGH SPEED ANALOG CIRCUITS

(75) Inventor: Eugene A. Fitzgerald, Windham, NH (US)

(73) Assignee: AmberWave Systems Corporation, Salem, NH (US)

( * ) Notice: Subject to any disclaimer, the term of this patent is extended or adjusted under 35 U.S.C. 154(b) by 19 days.

This patent is subject to a terminal disclaimer.

(21) Appl. No.: 10/967,998

(22) Filed: Oct. 19, 2004

(65) Prior Publication Data

US 2005/0077511 A1   Apr. 14, 2005

Related U.S. Application Data

(63) Continuation of application No. 10/774,890, filed on Feb. 9, 2004, which is a continuation of application No. 09/906,200, filed on Jul. 16, 2001, now Pat. No. 6,703,688.

(60) Provisional application No. 60/273,112, filed on Mar. 2, 2001.

(51) Int. Cl.
H01L 21/31 (2006.01)
(52) U.S. Cl. ............... 438/763; 438/285; 438/286; 438/E21.129
(58) Field of Classification Search ............... 439/167, 439/933, 938; 257/E21.125, E21.409, E21.411, 257/E21.45, E29.056; 438/285, 3–604, 197–199, 438/763–764
See application file for complete search history.

(56) References Cited

U.S. PATENT DOCUMENTS

| 4,010,045 A | 3/1977 | Ruehrwein |
| 4,522,662 A | 6/1985 | Bradbury et al. |
| 4,710,788 A | 12/1987 | Dambkes et al. |
| 4,717,681 A | 1/1988 | Curran |
| 4,749,441 A | 6/1988 | Christenson et al. |
| 4,755,478 A | 7/1988 | Abernathey et al. |
| 4,786,615 A | 11/1988 | Liaw et al. |
| 4,803,539 A | 2/1989 | Psaras et al. |
| 4,963,506 A | 10/1990 | Liaw et al. |
| 4,969,031 A | 11/1990 | Kobayashi et al. |
| 4,987,462 A | 1/1991 | Kim et al. |
| 4,990,979 A | 2/1991 | Otto |

(Continued)

FOREIGN PATENT DOCUMENTS

DE   41 01 167   7/1992

(Continued)

OTHER PUBLICATIONS

Armstrong et al., "Design of Si/SiGe Heterojunction Complementary Metal-Oxide-Semiconductor Transistors," IEDM Technical Digest (1995 International Electron Devices Meeting), pp. 761-764.

(Continued)

Primary Examiner—Dung A. Le
(74) Attorney, Agent, or Firm—Goodwin Procter LLP

(57) ABSTRACT

Structures and methods for fabricating high speed digital, analog, and combined digital/analog systems using planarized relaxed SiGe as the materials platform. The relaxed SiGe allows for a plethora of strained Si layers that possess enhanced electronic properties. By allowing the MOSFET channel to be either at the surface or buried, one can create high-speed digital and/or analog circuits. The planarization before the device epitaxial layers are deposited ensures a flat surface for state-of-the-art lithography.

34 Claims, 17 Drawing Sheets

U.S. PATENT DOCUMENTS

| | | |
|---|---|---|
| 4,997,776 A | 3/1991 | Harame et al. |
| 5,013,681 A | 5/1991 | Godbey et al. |
| 5,034,348 A | 7/1991 | Hartswick et al. |
| 5,089,872 A | 2/1992 | Ozturk et al. |
| 5,091,767 A | 2/1992 | Bean et al. |
| 5,108,946 A | 4/1992 | Zdebel et al. |
| 5,155,571 A | 10/1992 | Wang et al. |
| 5,166,084 A | 11/1992 | Pfiester |
| 5,177,583 A | 1/1993 | Endo et al. |
| 5,198,689 A | 3/1993 | Fujioka et al. |
| 5,202,284 A | 4/1993 | Kamins et al. |
| 5,207,864 A | 5/1993 | Bhat et al. |
| 5,208,182 A | 5/1993 | Narayan et al. |
| 5,212,110 A | 5/1993 | Pfiester et al. |
| 5,212,112 A | 5/1993 | Lynch |
| 5,217,923 A | 6/1993 | Suguro et al. |
| 5,221,413 A | 6/1993 | Brasen et al. |
| 5,225,703 A | 7/1993 | Nakatani et al. |
| 5,240,876 A | 8/1993 | Gaul et al. |
| 5,241,197 A | 8/1993 | Murakami et al. |
| 5,242,847 A | 9/1993 | Ozturk et al. |
| 5,243,207 A | 9/1993 | Plumton et al. |
| 5,250,445 A | 10/1993 | Bean et al. |
| 5,285,086 A | 2/1994 | Fitzgerald |
| 5,291,439 A | 3/1994 | Kauffmann et al. |
| 5,294,564 A | 3/1994 | Karapiperis et al. |
| 5,298,452 A | 3/1994 | Meyerson |
| 5,304,834 A | 4/1994 | Lynch |
| 5,310,451 A | 5/1994 | Tejwani et al. |
| 5,316,958 A | 5/1994 | Meyerson |
| 5,334,861 A | 8/1994 | Pfiester et al. |
| 5,336,903 A | 8/1994 | Ozturk et al. |
| 5,346,840 A | 9/1994 | Fujioka et al. |
| 5,346,848 A | 9/1994 | Grupen-Shemansky et al. |
| 5,374,564 A | 12/1994 | Bruel |
| 5,399,522 A | 3/1995 | Ohori |
| 5,413,679 A | 5/1995 | Godbey |
| 5,424,243 A | 6/1995 | Takasaki |
| 5,426,069 A | 6/1995 | Selvakumar et al. |
| 5,426,316 A | 6/1995 | Mohammad |
| 5,442,205 A | 8/1995 | Brasen et al. |
| 5,461,243 A | 10/1995 | Ek et al. |
| 5,461,250 A | 10/1995 | Burghartz et al. |
| 5,462,883 A | 10/1995 | Dennard et al. |
| 5,476,813 A | 12/1995 | Naruse |
| 5,479,033 A | 12/1995 | Baca et al. |
| 5,484,664 A | 1/1996 | Kitahara et al. |
| 5,496,750 A | 3/1996 | Moslehi |
| 5,496,771 A | 3/1996 | Cronin et al. |
| 5,523,243 A | 6/1996 | Mohammad |
| 5,523,592 A | 6/1996 | Nakagawa et al. |
| 5,534,713 A | 7/1996 | Ismail et al. |
| 5,536,361 A | 7/1996 | Kondo et al. |
| 5,540,785 A | 7/1996 | Dennard et al. |
| 5,571,373 A | 11/1996 | Krishna et al. |
| 5,572,043 A | 11/1996 | Shimizu et al. |
| 5,596,527 A | 1/1997 | Tomioka et al. |
| 5,617,351 A | 4/1997 | Bertin et al. |
| 5,630,905 A | 5/1997 | Lynch et al. |
| 5,633,202 A | 5/1997 | Brigham et al. |
| 5,659,187 A | 8/1997 | Legoues et al. |
| 5,659,194 A | 8/1997 | Iwamatsu et al. |
| 5,683,934 A | 11/1997 | Candelaria |
| 5,698,869 A | 12/1997 | Yoshimi et al. |
| 5,705,421 A | 1/1998 | Matsushita et al. |
| 5,710,450 A | 1/1998 | Chau et al. |
| 5,714,777 A | 2/1998 | Ismail et al. |
| 5,728,623 A | 3/1998 | Mori |
| 5,739,567 A | 4/1998 | Wong |
| 5,759,898 A | 6/1998 | Ek et al. |
| 5,777,347 A | 7/1998 | Bartelink |
| 5,786,612 A | 7/1998 | Otani et al. |
| 5,786,614 A | 7/1998 | Chuang et al. |
| 5,792,679 A | 8/1998 | Nakato |
| 5,808,344 A | 9/1998 | Ismail et al. |
| 5,821,577 A | 10/1998 | Crabbé et al. |
| 5,844,260 A | 12/1998 | Ohori et al. |
| 5,847,419 A | 12/1998 | Imai et al. |
| 5,869,359 A | 2/1999 | Prabhakar |
| 5,877,070 A | 3/1999 | Goesele et al. |
| 5,877,535 A | 3/1999 | Matsumoto et al. |
| 5,891,769 A * | 4/1999 | Liaw et al. .................. 438/167 |
| 5,906,708 A | 5/1999 | Robinson et al. |
| 5,906,951 A | 5/1999 | Chu et al. |
| 5,912,479 A | 6/1999 | Mori et al. |
| 5,933,741 A | 8/1999 | Tseng et al. |
| 5,943,560 A | 8/1999 | Chang et al. |
| 5,963,817 A | 10/1999 | Chu et al. |
| 5,966,622 A | 10/1999 | Levine et al. |
| 5,976,939 A | 11/1999 | Thompson et al. |
| 5,998,807 A | 12/1999 | Lustig et al. |
| 6,008,111 A | 12/1999 | Fushida et al. |
| 6,013,134 A | 1/2000 | Chu et al. |
| 6,030,887 A | 2/2000 | Desai et al. |
| 6,030,889 A | 2/2000 | Aulicino et al. |
| 6,033,974 A | 3/2000 | Henley et al. |
| 6,033,995 A | 3/2000 | Muller |
| 6,058,044 A | 5/2000 | Sugiura et al. |
| 6,059,895 A | 5/2000 | Chu et al. |
| 6,066,563 A | 5/2000 | Nagashima et al. |
| 6,074,919 A | 6/2000 | Gardner et al. |
| 6,096,590 A | 8/2000 | Chan et al. |
| 6,096,647 A | 8/2000 | Yang et al. |
| 6,103,559 A | 8/2000 | Gardner et al. |
| 6,107,653 A | 8/2000 | Fitzgerald |
| 6,111,267 A | 8/2000 | Fischer et al. |
| 6,117,750 A | 9/2000 | Bensahel et al. |
| 6,121,100 A | 9/2000 | Andideh et al. |
| 6,130,453 A | 10/2000 | Mei et al. |
| 6,132,806 A | 10/2000 | Dutartre |
| 6,133,124 A | 10/2000 | Horstmann et al. |
| 6,133,799 A | 10/2000 | Favors et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,159,852 A | 12/2000 | Nuttall et al. |
| 6,159,856 A | 12/2000 | Nagano et al. |
| 6,160,303 A | 12/2000 | Fattaruso |
| 6,162,688 A | 12/2000 | Gardner et al. |
| 6,184,111 B1 | 2/2001 | Henley et al. |
| 6,187,657 B1 | 2/2001 | Xiang et al. |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto |
| 6,210,988 B1 | 4/2001 | Howe et al. |
| 6,214,679 B1 | 4/2001 | Murthy et al. |
| 6,218,677 B1 | 4/2001 | Broekaert |
| 6,228,694 B1 | 5/2001 | Doyle et al. |
| 6,232,138 B1 | 5/2001 | Fitzgerald et al. |
| 6,235,567 B1 | 5/2001 | Huang |
| 6,235,568 B1 | 5/2001 | Murthy et al. |
| 6,235,575 B1 | 5/2001 | Kasai et al. |
| 6,242,324 B1 | 6/2001 | Kub et al. |
| 6,242,327 B1 | 6/2001 | Yokoyama et al. |
| 6,246,077 B1 | 6/2001 | Kobayashi et al. |
| 6,249,022 B1 | 6/2001 | Lin et al. |
| 6,251,755 B1 | 6/2001 | Furukawa et al. |
| 6,251,780 B1 | 6/2001 | Sohn et al. |
| 6,261,929 B1 | 7/2001 | Gehrke et al. |
| 6,266,278 B1 | 7/2001 | Harari et al. |
| 6,268,257 B1 | 7/2001 | Wieczorek et al. |

| | | | | | | |
|---|---|---|---|---|---|---|
| 6,271,551 B1 | 8/2001 | Schmitz et al. | | 6,677,192 B1 | 1/2004 | Fitzgerald |
| 6,271,726 B1 | 8/2001 | Fransis et al. | | 6,682,965 B1 | 1/2004 | Noguchi et al. |
| 6,281,532 B1 | 8/2001 | Doyle et al. | | 6,686,617 B2 | 2/2004 | Agnello et al. |
| 6,291,321 B1 | 9/2001 | Fitzgerald | | 6,690,043 B1 | 2/2004 | Usuda et al. |
| 6,294,448 B1 | 9/2001 | Chang et al. | | 6,699,765 B1 | 3/2004 | Shideler et al. |
| 6,306,698 B1 | 10/2001 | Wieczorek et al. | | 6,703,144 B2 | 3/2004 | Fitzgerald |
| 6,313,016 B1 | 11/2001 | Kibbel et al. | | 6,703,271 B2 | 3/2004 | Yeo et al. |
| 6,313,486 B1 | 11/2001 | Kencke et al. | | 6,703,648 B1 | 3/2004 | Xiang et al. |
| 6,315,384 B1 | 11/2001 | Ramaswami et al. | | 6,703,688 B1 | 3/2004 | Fitzgerald |
| 6,316,301 B1 | 11/2001 | Kant | | 6,709,903 B2 | 3/2004 | Christiansen et al. |
| 6,316,357 B1 | 11/2001 | Lin et al. | | 6,709,929 B2 | 3/2004 | Zhang et al. |
| 6,319,799 B1 | 11/2001 | Ouyang et al. | | 6,713,326 B2 | 3/2004 | Cheng et al. |
| 6,319,805 B1 | 11/2001 | Iwamatsu et al. | | 6,723,661 B2 | 4/2004 | Fitzgerald |
| 6,323,108 B1 | 11/2001 | Kub et al. | | 6,724,008 B2 | 4/2004 | Fitzgerald |
| 6,326,281 B1 | 12/2001 | Violette et al. | | 6,724,019 B2 | 4/2004 | Oda et al. |
| 6,326,664 B1 | 12/2001 | Chau et al. | | 6,730,551 B2 | 5/2004 | Lee et al. |
| 6,329,063 B2 | 12/2001 | Lo et al. | | 6,737,670 B2 | 5/2004 | Cheng et al. |
| 6,335,546 B1 | 1/2002 | Tsuda et al. | | 6,743,651 B2 | 6/2004 | Chu et al. |
| 6,339,232 B1 | 1/2002 | Takagi | | 6,743,684 B2 | 6/2004 | Liu |
| 6,342,421 B1 | 1/2002 | Mitani et al. | | 6,750,130 B1 | 6/2004 | Fitzgerald |
| 6,344,375 B1 | 2/2002 | Orita et al. | | 6,787,864 B2 | 9/2004 | Paton et al. |
| 6,350,311 B1 | 2/2002 | Chin et al. | | 6,797,571 B2 | 9/2004 | Nagaoka et al. |
| 6,350,993 B1 | 2/2002 | Chu et al. | | 6,812,086 B2 | 11/2004 | Murthy et al. |
| 6,352,909 B1 | 3/2002 | Usenko | | 6,818,537 B2 | 11/2004 | Cheong et al. |
| 6,362,071 B1 | 3/2002 | Nguyen et al. | | 6,818,938 B1 | 11/2004 | Naem et al. |
| 6,368,733 B1 | 4/2002 | Nishinaga | | 6,828,632 B2 | 12/2004 | Bhattacharyya |
| 6,368,927 B1 | 4/2002 | Lee et al. | | 6,830,976 B2 | 12/2004 | Fitzgerald |
| 6,369,438 B1 | 4/2002 | Sugiyama et al. | | 6,855,649 B2 | 2/2005 | Christiansen |
| 6,372,356 B1 | 4/2002 | Thornton et al. | | 6,855,990 B2 | 2/2005 | Yeo et al. |
| 6,372,593 B1 | 4/2002 | Hattori et al. | | 6,861,318 B2 | 3/2005 | Murthy et al. |
| 6,376,318 B1 | 4/2002 | Lee et al. | | 6,876,053 B1 | 4/2005 | Ma et al. |
| 6,380,008 B2 | 4/2002 | Kwok et al. | | 6,881,360 B2 | 4/2005 | Stange et al. |
| 6,391,798 B1 | 5/2002 | DeFelice et al. | | 6,885,084 B2 | 4/2005 | Murthy et al. |
| 6,399,970 B2 | 6/2002 | Kubo et al. | | 6,887,762 B1 | 5/2005 | Murthy et al. |
| 6,403,975 B1 | 6/2002 | Brunner et al. | | 6,887,773 B2 | 5/2005 | Gunn, III et al. |
| 6,406,973 B1 | 6/2002 | Lee et al. | | 6,890,835 B1 | 5/2005 | Chu et al. |
| 6,406,986 B1 | 6/2002 | Yu | | 6,900,103 B2 | 5/2005 | Fitzgerald |
| 6,407,406 B1 | 6/2002 | Tezuka | | 6,909,186 B2 | 6/2005 | Chu |
| 6,410,371 B1 | 6/2002 | Yu et al. | | 6,936,509 B2 | 8/2005 | Coolbaugh et al. |
| 6,420,937 B1 | 7/2002 | Akatsuka et al. | | 6,953,972 B2 | 10/2005 | Yeo et al. |
| 6,425,951 B1 | 7/2002 | Chu et al. | | 6,974,733 B2 | 12/2005 | Boyanov et al. |
| 6,429,061 B1 | 8/2002 | Rim | | 6,982,433 B2 | 1/2006 | Hoffman et al. |
| 6,461,960 B2 | 10/2002 | Lee et al. | | 6,992,355 B2 | 1/2006 | Mouli |
| 6,486,520 B1 | 11/2002 | Okuno et al. | | 6,995,430 B2 | 2/2006 | Langdo et al. |
| 6,492,216 B1 | 12/2002 | Yeo et al. | | 2001/0001724 A1 | 5/2001 | Kwok et al. |
| 6,498,359 B2 | 12/2002 | Schmidt et al. | | 2001/0003269 A1 | 6/2001 | Wu et al. |
| 6,500,694 B1 | 12/2002 | Enquist | | 2001/0003364 A1 | 6/2001 | Sugawara et al. |
| 6,503,833 B1 | 1/2003 | Ajmera et al. | | 2001/0009303 A1 | 7/2001 | Tang et al. |
| 6,509,587 B2 | 1/2003 | Sugiyama et al. | | 2001/0031535 A1 | 10/2001 | Agnello et al. |
| 6,521,041 B2 | 2/2003 | Wu et al. | | 2001/0045604 A1 | 11/2001 | Oda et al. |
| 6,521,508 B1 | 2/2003 | Cheong et al. | | 2002/0001948 A1 | 1/2002 | Lee |
| 6,524,935 B1 | 2/2003 | Canaperi et al. | | 2002/0019127 A1 | 2/2002 | Givens |
| 6,555,839 B2 | 4/2003 | Fitzgerald | | 2002/0024395 A1 | 2/2002 | Akatsuka et al. |
| 6,555,880 B2 | 4/2003 | Cabral, Jr. et al. | | 2002/0043660 A1 | 4/2002 | Yamazaki et al. |
| 6,562,703 B1 | 5/2003 | Maa et al. | | 2002/0048910 A1 | 4/2002 | Taylor, Jr. et al. |
| 6,563,152 B2 | 5/2003 | Roberds et al. | | 2002/0052084 A1 | 5/2002 | Fitzgerald |
| 6,566,718 B2 | 5/2003 | Wieczorek et al. | | 2002/0056879 A1 | 5/2002 | Wieczorek et al. |
| 6,573,126 B2 | 6/2003 | Cheng et al. | | 2002/0063292 A1 | 5/2002 | Armstrong et al. |
| 6,573,160 B2 | 6/2003 | Taylor, Jr. et al. | | 2002/0068393 A1 | 6/2002 | Fitzgerald et al. |
| 6,583,015 B2 | 6/2003 | Fitzgerald et al. | | 2002/0072130 A1 | 6/2002 | Cheng et al. |
| 6,591,321 B1 | 7/2003 | Arimilli et al. | | 2002/0084000 A1 | 7/2002 | Fitzgerald |
| 6,593,191 B2 | 7/2003 | Fitzgerald | | 2002/0096717 A1 | 7/2002 | Chu et al. |
| 6,593,641 B1 | 7/2003 | Fitzgerald | | 2002/0100942 A1 | 8/2002 | Fitzgerald et al. |
| 6,597,016 B1 | 7/2003 | Yuki et al. | | 2002/0123167 A1 | 9/2002 | Fitzgerald |
| 6,602,613 B1 | 8/2003 | Fitzgerald | | 2002/0123183 A1 | 9/2002 | Fitzgerald |
| 6,603,156 B2 | 8/2003 | Rim | | 2002/0123197 A1 | 9/2002 | Fitzgerald et al. |
| 6,605,498 B1 | 8/2003 | Murthy et al. | | 2002/0125471 A1 | 9/2002 | Fitzgerald et al. |
| 6,607,948 B1 | 8/2003 | Sugiyama et al. | | 2002/0125497 A1 | 9/2002 | Fitzgerald |
| 6,621,131 B2 | 9/2003 | Murthy et al. | | 2002/0140031 A1 | 10/2002 | Rim |
| 6,646,322 B2 | 11/2003 | Fitzgerald | | 2002/0168864 A1 | 11/2002 | Cheng et al. |
| 6,649,480 B2 | 11/2003 | Fitzgerald et al. | | 2002/0190284 A1 | 12/2002 | Murthy et al. |
| 6,657,223 B1 | 12/2003 | Wang et al. | | 2003/0003679 A1 | 1/2003 | Doyle et al. |
| 6,674,150 B2 | 1/2004 | Takagi et al. | | 2003/0013323 A1 | 1/2003 | Hammond et al. |

| | | | |
|---|---|---|---|
| 2003/0025131 A1 | 2/2003 | Lee et al. | |
| 2003/0034529 A1 | 2/2003 | Fitzgerald et al. | |
| 2003/0057439 A1 | 3/2003 | Fitzgerald | |
| 2003/0080361 A1 | 5/2003 | Murthy et al. | |
| 2003/0089901 A1 | 5/2003 | Fitzgerald | |
| 2003/0102498 A1 | 6/2003 | Braithwaite et al. | |
| 2003/0113971 A1 | 6/2003 | Nagaoka et al. | |
| 2003/0162348 A1 | 8/2003 | Yeo et al. | |
| 2003/0199126 A1 | 10/2003 | Chu et al. | |
| 2003/0203600 A1 | 10/2003 | Chu et al. | |
| 2003/0215990 A1 | 11/2003 | Fitzgerald et al. | |
| 2003/0218189 A1 | 11/2003 | Christiansen et al. | |
| 2003/0227029 A1 | 12/2003 | Lochtefeld et al. | |
| 2003/0227057 A1 | 12/2003 | Lochtefeld et al. | |
| 2004/0005740 A1 | 1/2004 | Lochtefeld et al. | |
| 2004/0007724 A1 | 1/2004 | Murthy et al. | |
| 2004/0014276 A1 | 1/2004 | Murthy et al. | |
| 2004/0014304 A1 | 1/2004 | Bhattacharyya | |
| 2004/0031979 A1 | 2/2004 | Lochtefeld | |
| 2004/0041210 A1 | 3/2004 | Mouli | |
| 2004/0061191 A1 | 4/2004 | Paton et al. | |
| 2004/0070035 A1 | 4/2004 | Murthy et al. | |
| 2004/0075148 A1 | 4/2004 | Kumagai et al. | |
| 2004/0075149 A1 | 4/2004 | Fitzgerald et al. | |
| 2004/0084735 A1 | 5/2004 | Murthy et al. | |
| 2004/0119101 A1 | 6/2004 | Schrom et al. | |
| 2004/0121564 A1 | 6/2004 | Gogoi | |
| 2004/0142545 A1 | 7/2004 | Ngo et al. | |
| 2004/0173815 A1 | 9/2004 | Yeo et al. | |
| 2004/0175892 A1 | 9/2004 | Vatus et al. | |
| 2004/0217430 A1 | 11/2004 | Chu | |
| 2004/0219726 A1 | 11/2004 | Fitzgerald | |
| 2004/0251776 A1 | 12/2004 | Hoffmann et al. | |
| 2004/0253774 A1 | 12/2004 | Boyanov et al. | |
| 2004/0256613 A1 | 12/2004 | Oda et al. | |
| 2004/0262683 A1 | 12/2004 | Bohr et al. | |
| 2005/0009263 A1 | 1/2005 | Yeo et al. | |
| 2005/0042849 A1 | 2/2005 | Currie et al. | |
| 2005/0077511 A1 | 4/2005 | Fitzgerald | |
| 2005/0112048 A1 | 5/2005 | Tsakalakos et al. | |
| 2005/0130454 A1 | 6/2005 | Murthy et al. | |
| 2005/0156169 A1 | 7/2005 | Chu | |
| 2005/0156180 A1 | 7/2005 | Zhang et al. | |
| 2005/0156210 A1 | 7/2005 | Currie et al. | |
| 2005/0161711 A1 | 7/2005 | Chu | |
| 2005/0167652 A1 | 8/2005 | Hoffmann et al. | |
| 2005/0176204 A1 | 8/2005 | Langdo et al. | |
| 2005/0250298 A1 | 11/2005 | Bauer | |
| 2005/0277272 A1 | 12/2005 | Singh et al. | |
| 2005/0280026 A1 | 12/2005 | Isaacson et al. | |
| 2005/0280098 A1 | 12/2005 | Shin et al. | |
| 2006/0008958 A1 | 1/2006 | Yeo et al. | |
| 2006/0009001 A1 | 1/2006 | Huang et al. | |
| 2006/0057825 A1 | 3/2006 | Bude et al. | |

FOREIGN PATENT DOCUMENTS

| | | |
|---|---|---|
| EP | 0390661 | 10/1990 |
| EP | 0 514 018 | 11/1992 |
| EP | 0 587 520 | 3/1994 |
| EP | 0 683 522 | 11/1995 |
| EP | 0 828 296 | 3/1998 |
| EP | 0 829 908 | 3/1998 |
| EP | 0 838 858 | 4/1998 |
| EP | 1 020 900 | 7/2000 |
| EP | 1 174 928 | 1/2002 |
| FR | 2 701 599 | 9/1993 |
| GB | 2 342 777 | 4/2000 |
| JP | 61/141116 | 6/1986 |
| JP | 2/210816 | 8/1990 |
| JP | 3/036717 | 2/1991 |
| JP | 4-74415 | 3/1992 |
| JP | 4-307974 | 10/1992 |
| JP | 5-166724 | 7/1993 |
| JP | 6-177046 | 6/1994 |
| JP | 6-244112 | 9/1994 |
| JP | 6-252046 | 9/1994 |
| JP | 7-094420 | 4/1995 |
| JP | 7-106446 | 4/1995 |
| JP | 7-240372 | 9/1995 |
| JP | 10-270685 | 10/1998 |
| JP | 11-233744 | 8/1999 |
| JP | 2000-021783 | 1/2000 |
| JP | 2000-031491 | 1/2000 |
| JP | 2001-319935 | 11/2001 |
| JP | 2002-076334 | 3/2002 |
| JP | 2002-164520 | 6/2002 |
| JP | 2002-324765 | 8/2002 |
| JP | 2002-289533 | 10/2002 |
| WO | 98/59365 | 12/1998 |
| WO | 99/53539 | 10/1999 |
| WO | 00/48239 | 8/2000 |
| WO | 00/54338 | 9/2000 |
| WO | 01/22482 | 3/2001 |
| WO | 01/54202 | 7/2001 |
| WO | 01/93338 | 12/2001 |
| WO | 01/99169 | 12/2001 |
| WO | 02/13262 | 2/2002 |
| WO | 02/15244 | 2/2002 |
| WO | 02/27783 | 4/2002 |
| WO | 02/47168 | 6/2002 |
| WO | 02/071488 | 9/2002 |
| WO | 02/071491 | 9/2002 |
| WO | 02/071495 | 9/2002 |
| WO | 02/082514 | 10/2002 |
| WO | 04/006311 | 1/2004 |
| WO | 04/006327 | 1/2004 |

OTHER PUBLICATIONS

Armstrong, "Technology for SiGe Heterostructure-Based CMOS Devices," Ph.D. Thesis, Massachusetts Institute of Technology, Department of Electrical Engineering and Computer Science (Jun. 30, 1999), pp. 1-154.

Augusto et al., "Proposal for a New Process Flow for the Fabrication of Silicon-based Complementary MOD-MOSFETs without Ion Implantation," *Thin Solid Films*, vol. 294, No. 1-2 (Feb. 15, 1997), pp. 254-258.

Barradas et al., "RBS analysis of MBE-grown SiGe/(001) Si heterostructures with thin, high Ge content SiGe channels for HMO transistors," *Modern Physics Letters B*, vol. 15, No. 28-29 ( Dec. 2001), abstract.

Borenstein et al., "A New Ultra-Hard Etch-Stop Layer for High Precision Micromachining," Proceedings of the 1999 12th IEEE International Conference on Micro Electro Mechanical Systems (MEMs) (Jan. 17-21, 1999), pp. 205-210.

Bouillon et al., "Search for the optimal channel architecture for 0.18/0.12 μm bulk CMOS experimental study," IEEE, (1996), pp. 21.2.1-21.2.4.

Bruel et al., "® Smart Cut: A Promising New SOI Material Technology," Proceedings of the 1995 IEEE International SOI Conference (Oct. 1995), pp. 178-179.

Bruel, "Silicon on Insulator Material Technology," *Electronic Letters*, vol. 31, No. 14 (Jul 6, 1995), pp. 1201-1202.

Bufler et al., "Hole transport in strained $Si_{1-x}Ge_x$ alloys on $Si_{1-y}Ge_y$ substrates," *Journal of Applied Physics*, vol. 84, No. 10 (Nov. 15, 1998), pp. 5597-5602.

Burghartz et al., "Microwave Inductors and Capacitors in Standard Multilevel Interconnect Silicon Technology," *IEEE Transactions on Microwave Theory and Techniques*, vol. 44, No. 1 (Jan. 1996), pp. 100-104.

Canaperi et al., "Preparation of a relaxed Si-Ge layer on an insulator in fabricating high-speed semiconductor devices with strained epitaxial films," International Business Machines Corporation, 2002 (abstract).

Carlin et al., "High Efficiency GaAs-on-Si Solar Cells with High Voc Using Graded GeSi Buffers," IEEE (2000), pp. 1006-1011.
Chang et al., "Selective Etching of SiGe/Si Heterostructures," *Journal of the Electrochemical Society*, No. 1 (Jan. 1991), pp. 202-204.
Cheng et al., "Electron Mobility Enhancement in Strained-Si n-MOSFETs Fabricated on SiGe-on-Insulator (SGOI) Substrates," *IEEE Electron Device Letters*, vol. 22, No. 7 (Jul. 2001), pp. 321-323.
Cheng et al., "Relaxed Silicon-Germanium on Insulator Substrate by Layer Transfer," *Journal of Electronic Materials*, vol. 30, No. 12 (2001), pp. L37-L39.
Cullis et al., "Growth ripples upon strained SiGe epitaxial layers on Si and misfit dislocation interactions," *Journal of Vacuum Science and Technology A*, vol. 12, No. 4 (Jul. Aug. 1994), pp. 1924-1931.
Currie et al., "Controlling Threading Dislocation in Ge on Si Using Graded SiGe Layers and Chemical-Mechanical Polishing," *Applied Physics Letters*, vol. 72, No. 14 (Feb. 1998), pp. 1718-1720.
Currie et al., "Carrier mobilities and process stability of strained Si n- and p-MOSFETs on SiGe virtual substrates," *Journal of Vacuum Science and Technology B*, vol. 19, No. 6 (Nov./Dec. 2001), pp. 2268-2279.
Eaglesham et al., "Dislocation-Free Stranski-Krastanow Growth of Ge on Si(100)," *Physical Review Letters*, vol. 64, No. 16 (Apr. 16, 1990), pp. 1943-1946.
Feijoo et al., "Epitaxial Si-Ge Etch Stop Layers with with Ethylene Diamine Pyrocatechol for Bonded and Etchback Silicon-on-Insulator," *Journal of Electronic Materials*, vol. 23, No. 6 (Jun. 1994), pp. 493-496.
Fischetti et al., "Band structure, deformation potentials, and carrier mobility in strained Si, Ge, and SiGe alloys," *Journal of Applied Physics*, vol. 80, No. 4 (Aug. 15, 1996), pp. 2234-2252.
Fischetti, "Long-range Coulomb interactions in small Si devices. Part II. Effective electronmobility in thin-oxide structures," *Journal of Applied Physics*, vol. 89, No. 2 (Jan. 15, 2001), pp. 1232-1250.
Fitzgerald et al., "Dislocation dynamics in relaxed graded composition semiconductors," *Materials Science and Engineering*, B 67 (1999), pp. 53-61.
Fitzgerald et al., "Relaxed $Ge_xSi_{1-x}$ structures for III-V integration with Si and high mobility two-dimensional electron gases in Si," *Journal of Vacuum Science and Technology*, (Jul./Aug 1992), pp. 1807-1819.
Fitzgerald et al., "Totally Relaxed $Ge_xSi_{1-x}$ Layers with Low Threading Dislocation Densities Grown on Si Substrates," *Applied Physics Letters*, Vol. 59, No. 7 (Aug. 12, 1991), pp. 811-813.
Gannavaram, et al., "Low Temperature ($\leqq 800°$ C.) Recessed Junction Selective Silicon-Germanium Source/Drain Technology for sub-70 nm CMOS," *IEEE International Electron Device Meeting Technical Digest*, (2000), pp. 137-440.
Garone et al., "Silicon vapor phase epitaxial growth catalysis by the presence of germane," *Applied Physics Letters*, vol. 56, No. 13 (Mar. 26, 1990), pp. 1275-1277.
Ge et al., "Process-Strained Si (PSS) CMOS Technology Featuring 3D Strain Engineering," *IEEE International Electron Devices Meeting Technical Digest*, (2003) pp. 73-76.
Ghani et al., "A 90nm High Volume Manufacturing Logic Technology Featuring Novel 45nm Gate Length Strained Silicon CMOS Transistors," *IEEE International Electron Device Meeting Technical Digest*, (2003), 11.6.1-11.6.3.
Godbey et al., (1990) "Fabrication of Bond and Etch-Back Silicon Insulator Using a Strained $SI_{0.7}GE_{0.3}$ Layer as an Etch Stop," *Journal of the Electrical Society*, vol. 137, No. 10 (Oct. 1990) pp. 3219-3223.
Gray et al., "Analysis and Design of Analog Integrated Circuits," John Wiley & Sons, 1984, pp. 605-632.
Grillot et al., "Acceptor diffusion and segregation in $(Al_xGa_{1-x})_{0.5}In_{0.5}P$ heterostructures," *Journal of Applied Physics*, vol. 91, No. 8 (2002), pp. 4891-4899.
Grützmacher et al., "Ge segregation in SiGe/Si heterostructures and its dependence on deposition technique and growth atmosphere," *Applied Physics Letters*, vol. 63, No. 18 (Nov. 1, 1993), pp. 2531-2533.
Hackbarth et al., "Alternatives to Thick MBE-Grown Relaxed SiGe Buffers," *Thin Solid Films*, vol. 369 (2000), pp. 148-151.
Hackbarth et al., "Strain relieved SiGe buffers for Si-based heterostructure field-effect transistors," *Journal of Crystal Growth*, vol. 201/202 (1999), pp. 734-738.
Halsall et al., "Electron diffraction and Raman studies of the effect of substrate misorientation on ordering in the AlGaInP system," *Journal of Applied Physics*, vol. 85, No. 1 (1999), pp. 199-202.
Hamada et al., "A New Aspect of Mechanical Stress Effects in Scaled MOS Devices," *IEEE Transactions on Electron Devices*, vol. 38, No. 4 (Apr. 1991), pp. 895-900.
Herzog et al., "SiGe-Based FETs: Buffer Issues and Device Results," *Thin Solid Films*, vol. 380, No. 1-2 (Dec. 12, 2000), pp. 36-41.
Höck et al., "Carrier mobilities in modulation doped $Si_{1-x}Ge_x$ heterostructures with respect to FET applications," *Thin Solid Films*, vol. 336 (1998), pp. 141-144.
Höck et al., "High hole mobility in $Si_{0.17}Ge_{0.83}$ channel metal-oxide-semiconductor field-effect transistors grown by plasma-enhanced chemical vapor deposition," *Applied Physics Letters*, vol. 76, No. 26 (Jun. 26, 2000), pp. 3920-3922.
Höck et al., "High performance 0.25 μm p-type Ge/SiGe MODFETs," *Electronics Letters*, vol. 34, No. 19 (Sep. 17, 1998), pp. 1888-1889.
Hsu et al., "Surface morphology of related $Ge_xSi_{1-x}$ films," *Appl. Phys. Lett.*, vol. 61, No. 11 (1992), pp. 1293-1295.
Huang et al., (2001) "Carrier Mobility enhancement in strained Si-on-insulatoir fabricated by wafer bonding", *2001 Symposium on VLSI Technology, Digest of Technical Papers*, pp. 57-58.
Huang et al., "High-quality strain-relaxed SiGe alloy grown on implanted silicon-on-insulator substrate," *Applied Physics Letters*, vol. 76, No. 19 (May 8, 2000), pp. 2680-2682.
Huang et al., "Isolation Process Dependence of Channel Mobility in Thin-Film SOI Devices," *IEEE Electron Device Letters*, vol. 17, No. 6 (Jun. 1996), pp. 291-293.
Huang et al., "LOCOS-Induced Stress Effects on Thin-Film SOI Devices," *IEEE Transactions on Electron Devices*, vol. 44, No. 4 (Apr. 1997), pp. 646-650.
Huang et al., "The Impact of Scaling Down to Deep Submicron on CMOS RF Circuits," *IEEE Journal of Solid-State Circuits*, vol. 33, No. 7 (Jul. 1998), pp. 1023-1036.
Huang, et al., "Reduction of Source/Drain Series Resistance and Its Impact on Device Performance for PMOS Transistors with Raised $Si_{1-x}Ge_x$ Source/Drain", *IEEE Electron Device Letters*, vol. 21, No. 9, (Sep. 2000) pp. 448-450.
IBM Technical Disclosure Bulletin, "2 Bit/Cell EEPROM Cell Using Band to Band Tunneling for Data Read-Out," vol. 35, No. 4B (Sep. 1992), pp. 136-140.
IBM Technical Disclosure Bulletin, "Optimal Growth Technique and Structure for Strain Relaxation of Si-Ge Layers on Si Substrates," vol. 32, No. 8A (Jan. 1990), pp. 330-331.
Iida et al., "Thermal behavior of residual strain in silicon-on-insulator bonded wafer and effect on electron mobility," *Solid-State Electronics*, vol. 43 (1999), pp. 1117-1120.
Ishikawa et al., "Creation of Si-Ge-based SIMOX structures by low energy oxygen implantation," Proceedings of the 1997 IEEE International SOI Conference (Oct. 1997), pp. 16-17.
Ishikawa et al., "SiGe-on-insulator substrate using SiGe alloy grown Si(001)," *Applied Physics Letters*, vol. 75, No. 7 (Aug. 16, 1999), pp. 983-985.
Ismail et al., "Modulation-doped n-type Si/SiGe with Inverted Interface," *Applied Physics Letters*, vol. 65, No. 10 (Sep. 5, 1994), pp. 1248-1250.
Ismail, "Si/SiGe High-Speed Field-Effect Transistors," International Electron Device Meeting, Washington, D.C. (Dec. 10, 1995), pp. 20.1.1-20.1.4.
Ito et al., "Mechanical Stress Effect on Etch-Stop NItride and its Impact on Deep Submicron Transistor Design," *IEEE International Electron Devices Meeting Technical Digest*, (2000), pp. 247-250.
Kearney et al., "The effect of alloy scattering on the mobility of holes in a $Si_{1-x}Ge_x$ quantum well," *Semiconductor Science and Technology*, vol. 13 (1998), pp. 174-180.

Kim et al., "A Fully Integrated 1.9-GHz CMOS Low-Noise Amplifier," *IEEE Microwave and Guided Wave Letters*, vol. 8, No. 8 (Aug. 1998), pp. 293-295.

Koester et al., "Extremely High Transconductance $Ge/Si_{0.4}Ge_{0.6}$ p-MODFET's Grown by UHV-CVD," *IEEE Electron Device Letters*, vol. 21, No. 3 (Mar. 2000), pp. 110-112.

König et al., "Design Rules for n-Type SiGe Hetero FETs," *Solid State Electronics*, vol. 41, No. 10 (Oct. 1, 1997), pp. 1541-1547.

König et al., "p-Type Ge-Channel MODFET's with High Transconductance Grown on Si Substrates," *IEEE Electron Device Letters*, vol. 14, No. 4 (Apr. 1993), pp. 205-207.

König et al., "SiGe HBTs and HFETs," *Solid-State Electronics*, vol. 38, No. 9 (1995), pp. 1595-1602.

Kummer et al., "Low engergy plasma enhanced chemical vapor deposition," *Materials Science and Engineering B*, 89 (2002), pp. 288-295.

Kuznetsov et al., "Technology for high-performance n-channel SiGe modulation-doped field-effect transistors," *Journal of Vacuum Science and Technology B*, vol. 13, No. 6 (Nov./Dec. 1995), pp. 2892-2896.

Langdo et al., (2002) "Preparation of Novel SiGe-free Strained Si on Insulator Substrates" *IEEE International SOI Conference*, pp. 211-212 (XP002263057).

Larson, "Integrated Circuit Technology Options for RFIC's—Present Status and Future Directions," *IEEE Journal of Solid-State Circuits*, vol. 33, No. 3 (Mar. 1998), pp. 387-399.

Lee et al., "CMOS RF Integrated Circuits at 5 GHz and Beyond," *Proceedings of the IEEE*, vol. 88, No. 10 (Oct. 2000), pp. 1560-1571.

Lee et al., "Strained Ge channel p-type metal-oxide-semiconductor field-effect transistors grown on $Si_{1-x}Ge_x$/Si virtual substrated," *Applied Physics Letters*, vol. 79, No. 20 (Nov. 12, 2001), pp. 3344-3346.

Lee et al., "Strained Ge channel p-type MOSFETs fabricated on $Si_{1-x}Ge_x$/Si virtual substrates," *Material Research Society Symposium Proceedings*, vol. 686 (2002), pp. A1.9.1-A1.9.5.

Leitz et al., "Channel Engineering of SiGe-Based Heterostructures for High Mobility MOSFETs," *Material Research Society Symposium Proceedings*, vol. 686 (2002), pp. A3.10.1-A3.10-6.

Leitz et al., "Dislocation glide and blocking kinetics in compositionally graded SiGe/Si," *Journal of Applied Physics*, vol. 90, No. 6 (Sep. 15, 2001), pp. 2730-2736.

Leitz et al., "Hole mobility enhancements in strained $Si/Si_{1-y}Ge_y$ p-type metal oxide-semiconductor field-effect transistors grown on relaxed $Si_{1-x}Ge_x$ (x<y) virtual substrates," *Applied Physics Letters*, vol. 79, No. 25 (Dec. 17, 2001), pp. 4246-4248.

Li et al., "Design of high speed Si/SiGe heterojunction complementary metal-oxide-semiconductor field effect transistors with reduced short-channel effects," *Vacuum Science and Technology A*, Vol. 20, No. 3 (May/Jun. 2002), pp. 1030-1033.

Lochtefeld et al., "Investigating the Relationship Between Electron Mobility and Velocity in Deeply Scaled NMOS via Mechanical Stress," *IEEE Electron Device Letters*, vol. 22, No. 12 (2001), pp. 591-593.

Lu et al., "High Performance 0.1 μm Gate-Length P-Type SiGe MODFET's and MOS-MODFET's," *IEEE Transactions on Electron Devices*, vol. 47, No. 8 (Aug. 2000), pp. 1645-1652.

Maiti et al., "Strained-Si Heterostructure Field Effect Transistors," *Semiconductor Science and Technology*, vol. 13 (1998), pp. 1225-1246.

Maszara, "Silicon-On-Insulator by Wafer Bonding: A Review," *Journal of the Electrochemical Society*, No. 1 (Jan. 1991), pp. 341-347.

Meyerson et al., "Cooperative Growth Phenomena in Silicon/Germanium Low-Temperature Epitaxy," *Applied Physics Letters*, vol. 53, No. 25 (Dec. 19, 1988), pp. 2555-2557.

Mizuno et al., "Advanced SOI-MOSFETs with Strained-Si Channel for High Speed CMOS-Electron/Hole Mobility Enhancement," Digest of Technical Papers, 2002 Symposium on VLSI Technology, Honolulu, Jun. 13-15, New York, NY, pp. 210-211.

Mizuno et al., "Electron and Hole Mobility Enhancement in Strained-Si MOSFET's on SiGe-on-Insulator Substrates Fabricated by SIMOX Technology," *IEEE Electron Device Letters*, vol. 21, No. 5 (May 2000), pp. 230-232.

Mizuno et al., "High Performance Strained-Si p-MOSFETs on SiGe-on-Insulator Substrates Fabricated by SIMOX Technology," *IEEE IDEM Technical Digest*, (1999 International Electron Device Meeting), pp. 934-936.

Nayak et al., "High-Mobility Strained-Si PMOSFET's," *IEEE Transactions on Electron Devices*, vol. 43, No. 10 (Oct. 1996), pp. 1709-1716.

O'Neill et al., "SiGe Virtual Substrate N-Channel Heterojunction MOSFETs," *Semiconductor Science and Technology*, vol. 14 (1999), pp.784-789.

Ootsuka et al., "A Highly Dense, High-Performance 130nm node CMOS Technology for Large Scale System-on-a-Chip Applications," *IEEE International Electron Devices Meeting Technical Digest*, (2000), pp. 575-578.

Ota et al., "Application of heterojunction FET to power amplifier for cellular telephone," *Electronic Letter*, vol. 30, No. 11 (May 26, 1994), pp. 906-907.

Ota et al., "Novel Locally Strained Channel Technique for High Performance 55nm CMOS," *IEEE International Electron Devices Meeting Technical Digest*, (2002), pp. 27-30.

Öztürk, et al., "Advanced $Si_{1-x}Ge_x$ Source/Drain and Contact Technologies for Sub-70 nm CMOS," *IEEE International Electron Device Meeting Technical Digest*, (2002), pp. 375-378.

Öztürk, et al., "Low Resistivity Nickel Germanosilicide Contacts to Ultra-Shallow $Si_{1-x}Ge_x$ Source/Drain Junctions for Nanoscale CMOS," *IEEE International Electron Device Meeting Technical Digest* (2003), pp. 497-500.

Öztürk, et al., "Selective Silicon-Gremanium Source/Drain Technology for Nanoscale CMOS," *Mat. Res. Soc. Symp. Proc.*, vol. 717, (2002), pp. C4.1.1-C4.1.12.

Öztürk, et al., "Ultra-Shallow Source/Drain Junctions for Nanoscale CMOS Using Selective Silicon-Germanium Technology," *Extended Abstracts of International Workshop on Junction Technology*, (2001), pp. 77-82.

Papananos, "Radio-Frequency Microelectronic Circuits for Telecommunication Applications," (1999), pp. 115-117, 188-193.

Parker et al., "SiGe Heterostructure CMOS Circuits and Applications," *Solid-State Electronics*, vol. 43 (1999), pp. 1497-1506.

Ransom et al., "Gate-Self-Aligned n-channel and p-channel Germanium MOSFET's," *IEEE Transactions on Electron Devices*, vol. 38, No. 12 (Dec. 1991), p. 2695.

Reinking et al., "Fabrication of high-mobility Ge p-channel MOSFETs on Si substrates," *Electronics Letters*, vol. 35, No. 6 (Mar. 18, 1999), pp. 503-504.

Rim et al., "Enhanced Hole Mobilities in Surface-channel Strained-Si p-MOSFETs," *IEEE*, (1995), pp. 517-520.

Rim et al., "Fabrication and Analysis of Deep Submicron Strained-Si N-MOSFETs," *IEEE Transactions on Electron Devices*, vol. 47, No. 7 (Jul. 2000), pp. 1406-1415.

Rim, "Application of Silicon-Based Heterostructures to Enhanced Mobility Metal-Oxide-Semiconductor Field-Effect Transistors," Ph.D. Thesis, Stanford University, 1999, pp. 1-184.

Robbins et al., "A model for heterogeneous growth of $Si_{1-x}Ge_x$ films for hydrides," *Journal of Applied Physics*, vol. 69, No. 6 (Mar. 15, 1991), pp. 3729-3732.

Sadek et al., "Design of Si/SiGe Heterojunction Complementary Metal-Oxide-Semiconductor Transistors," *IEEE Transactions on Electron Devices*, vol. 13, No. 8 (Aug. 1996), pp. 1224-1232.

Sakaguchi et al., "ELTRAN by splitting porous Si layers," Proceedings of the 195th Int. SOI Symposium, Electrochemical Society, vol. 99-3 (1999), pp. 117-121.

Schäffler, "High-Mobility Si and Ge Structures," *Semiconductor Science and Technology*, vol. 12 (1997), pp. 1515-1549.

Shimizu et al., "Local Mechanical-Stress Control (LMC): A New Technique for CMOS-Performance Enchancement," *IEEE International Electron Devices Meeting Technical Digest*, (2001), pp. 433-436.

Sugimoto et al., "A 2V, 500 MHz and 3V, 920 MHz Low-Power Current-Mode 0.6 μm CMOS VCO Circuit," Institute of Electronics, Information and Communication Engineers, vol. E82-C, No. 7 (Jul. 1999), pp.1 1327-1329.

Ternent et al., "Metal Gate Strained Silicon MOSFETs for Microwave Integrated Circuits," IEEE (Oct. 2000), pp. 38-43.

Thompson et al., "A 90 nm Logic Technology Featuring 50nm Strained-Silicon Channel Transistors, 7 layers of Cu *Interconnects, Low k ILD, and 1 um$^2$ SRAM Cell," IEEE International Electron Devices Meeting Technical Digest*, (2002), pp. 61-64.

Thompson et al., "A Logic Nanotechnology Featuring Strained-Silicon," *IEEE Electron Device Letters*, vol. 25, No. 4 (Apr. 2004), pp. 191-193.

Tiwari et al., "Hole Mobility Improvement in Silicon-on-Insulator and Bulk Silicon Transistors Using Local Strain," *IEEE International Electron Devices Meeting Technical Digest*, (1997), pp. 939-941.

Tsang et al., "Measurements of alloy composition and strain in thin $Ge_xSi_{1-x}$ layers," *Journal of Applied Physics*, vol. 75, No. 12 (Jun. 15, 1994), pp. 8098-8108.

Tweet et al., "Factors determining the composition of strained GeSi layers grown with disilane and germane," *Applied Physics Letters*, vol. 65, No. 20 (Nov. 14, 1994), pp. 2579-2581.

Uchino, et al., "A Raised Source/Drain Technology Using In-situ P-doped SiGe and B-doped Si for 0.1-μm CMOS ULSIs," *IEEE International Electron Device Meeting Technical Digest*, (1997), pp. 479-482.

Usami et al., "Spectroscopic study of Si-based quantum wells with neighboring confinement structure," *Semiconductor Science and Technology*, vol. 12 (1997), pp. 1596-1602.

Welser et al., "Electron Mobility Enhancement in Strained-Si N-Type Metal-Oxide-Semiconductor Field-Effect Transistors," *IEEE Electron Device Letters*, vol. 15, No. 3 (Mar. 1994), pp. 100-102.

Welser et al., "Evidence of Real-Space Hot-Electron Transfer in High Mobility, Strained-Si Multilayer MOSFETs," *IEDM*, (1993), pp. 545-548.

Welser et al., "NMOS and PMOS Transistors Fabricated in Strained Silicon/Relaxed Silicon-Germanium Structures," *IEDM*, (1992), pp. 1000-1002.

Welser, "The Application of Strained-Silicon/Relaxed-Silicon Germanium Heterostructures to Metal-Oxide-Semiconductor Field-Effect Transistors," Ph.D. Thesis, Stanford University, Dept. of Electrical Engineering (1994), pp. 1-127.

Wolf et al., *Silicon Processing for the VLSI Era, vol. 1: Process Technology*, Lattice Press, Sunset Beach, CA, (1986), pp. 384-386.

Xie et al., "Semiconductor Surface Roughness: Dependance on Sign and Magnitude of Bulk Strain," *Physical Review Letters*, vol. 73, No. 22 (Nov. 28, 1994), pp. 3006-3009.

Xie et al., "Very high mobility two-dimensional hole gas in Si/$Ge_xSi_{1-x}$/Ge structures grown by molecular beam epitaxy," *Applied Physics Letters*, vol. 63, No. 16 (Oct. 18, 1993), pp. 2263-2264.

Xie, "SiGe field effect transistors," *Materials Science and Engineering*, vol. 25 (1999), pp. 89-121.

Yamagata et al., "Bonding, Splitting and Thinning by Porous Si in ELTRAN; SOI- Epi Wafer," *Material Research Society Symposium Proceedings*, vol. 681E (2001), pp. 18.2.1-18.2.10.

Yeo et al., "Nanoscale Ultra-Thin-Body Silicon-on-Insulator P-MOSFET with a SiGe/Si Heterostructure Channel," *IEEE Electron Device Letters*, vol. 21, No. 4 (Apr. 2000), pp. 161-163.

Zhang et al., "Demonstration of a GaAs-Based Compliant Substrate Using Wafer Bonding and Substrate Removal Techniques," *IEEE*, (1998), pp. 25-28.

Examination Report for European Patent Application No. 98 931 529.6-2203, dated Jan. 10, 2002, 4 pages.

Examination Report for European Patent Application No. 98 931 529.6-2203, dated May 9, 2003, 5 pages.

Examination Report for European Patent Application No. 01 973 651.1-1528, dated Mar. 22, 2004, 3 pages.

Examination Report for European Patent Application No. 01 989 893.1-1235, dated Aug. 16, 2004, 5 pages.

Examination Report for European Patent Application No. 01 973 651.1-1528, dated Nov. 12, 2004, 9 pages.

Examination Report for European Patent Application No. 02 709 406.9-2203, dated May 11, 2004, 3 pages.

Examination Report for European Patent Application No. 02 709 406.9-2203, dated Mar. 24, 2005, 5 pages.

International Search Report for Patent Application No. PCT/US 98/13076, dated Oct. 27, 1998, 4 pages.

Notice of Preliminary Rejection for Korean Patent Application No. 10-1999-7012279, dated Feb. 21, 2002, 2 pages (English translation attached).

Notice of Final Rejection for Korean Patent Application No. 10-1999-7012279, dated Feb. 25, 2003 2 pages (English translation attached).

Fitzgerald et al., "Dislocations in Relaxed SiGe/Si Heterostructures," Physica Status Solidi A, Applied Research, Berlin, DE, vol. 171, Nr. 1, p. 227-238, Jan. 16, 1999.

Klauk et al., "Thermal stability of undoped strained Si channel SiGe heterostructures," Applied Physics Letter No. 68, Apr. 1, 1996, pp. 1975-1977.

Rim et al., "Enhanced Hole Mobilities in Surface-channel Strained-Si- p-MOSFETs," IEEE (1995), p. 20.3.1-20.3.4.

Rosenblad et al., "Strain relaxation of graded SiGe buffers brown at very high rates," Materials Science and Engineering B, Elsevier Sequoia, Lausanne, CH, vol. 71, Nr. 1-3, p. 20-23, Feb. 2000.

Sugii, et al., "Role of $Si_{1-x}Ge_x$ buffer layer on mobility enhancement in a strained-Si channel metal-oxide-semiconductor field-effect transistor," Central Research Laboratory, Hitachi Ltd. 1-280 Higashi-Koigakuboj, Kokubunji-shi, Tokyo 185-8601 Japan, pp. 2948-2950.

Kubota M., et al. "New SOI CMOS Process with Selective Oxidation, " IEEE IEDM TECH. DIG., pp. 814-816, (1986).

O'Neill, et al. "Deep Submicron CMOS Based on Silicon Germanium Technology, " *Fellow*, IEEE Transactions on Electron Devices, vol. 43, No. 6, Jun. 1996 pp. 911-918.

Ming et al., "Interfacial roughness scaling and strain in lattice mismatched $Si_{0.4}GE_{0.6}$ thin films on Si" Applied Physics Letters, vol. 67, No. 5, Jul. 31, 1995, pp. 629-631.

Ming et al., "Microscopic structure of interfaces in $Si_{1-x}Ge_x$/Si heterostructures and superlattices studied by x-ray scattering and fluorescence yield," Physical Review B, vol. 47, No. 24, pp. 373-81, Jun 15, 1993.

Vossen et al. "Thin Film Processes II" Academic Press Inc., San Diego, CA, 1991, pp. 370-442.

Nishi et al. "Handbook of Semiconductor Manufacturing Technology," Marcel Dekker AG, New York, NY, 2000, pp. 1-22.

Wolfe et al. "Silicon Processing for the VLSI Era, vol. 1; Process Technology," Lattice Press 1986, pp. 124-160.

C. Rosenblad, et al., "Strain relaxation of graded SiGe buffers grown at very high rates," *Materials Science and Engineering*, 871 (2000), pp. 20-23.

E. A. Fitzgerald, et al., "Dislocations in Relaxed SiGe/Si Heterostructures," *Phys. Stat. Sol.*, (a) 171 (1999) pp. 227-238.

Abstreiter et al., "Silicon/Germainium Strained Layer Superlattices," Journal of Crystal Growth, 95:431-438 (1989).

Ahigren et al., *A SiGe HBT BICMOS Technology for Mixed-Signal RF Applications*, 1997 IEEE Bipolar/BiCMOS Circuits and Tech. Meeting 195.

Ahn et al., Film Stress-Related Vacancy Supersaturation in Silicon Under Low-Pressure Chemical Vapor Deposited Silicon Nitride Films, 64 J. Applied Physics 4914 (1988).

Aldrich et al., Stability of C54 Titanium Germanosilicide on a Silicon-Geranium Alloy Substrate, 77 J. Applied Physics, No. 10, 5107-5114 (1995).

AmberWave Systems Corporation's Second Supplemental Responses to Intel's Third Set of Interrogatories, U.S.D.C., District of Delaware, C.A. No. 05-301-KAJ (Jul. 12, 2006).

Antonelli et al., *Pressure and Strain Effects on Diffusion*, 163 Materials Res. Soc'y Sump. Proc. 523 (1989).

Antoniadis et al., "SOI Devices and Technology," *SOI devices and technology*, Neuilly sur Seine, France, (1999), pp. 81-87.

Aoyama et al., "Facet formation mechanism of silicon selective epitaxial layer by Si ultrahigh vacuum vapor deposition," *Journal of Crystal Growth*, 136 (1994), pp. 349-354.

Arst et al., "Surface planarity and microstructure of low temperature silicon SEG and ELO," *Journal of Materials Research*, vol. 6, No. 4, (Apr. 1991), pp. 784-791.

Auberton-Hervé et al., "SMART CUT® : The Basic Fabrication Process for UNIBOND® SO1 Wafers," IEICE Transactions on Electronics, E80-C(3):358-363 (1997).

Aubry-Fortuna et al., Phase Formation and Strain Relaxation During Thermal Reaction of Zr and Ti with Strained Si1-x-y GexCy Epilayers, 88 J. Applied Physics, No. 3, pp. 1418-1423 (2000).

Augendre et al., Elevated Source/Drain by Sacrificial Selective Epitaxy for High Performance Deep Submicron CMOS: Process Window Versus Complexity, 47 *IEEE Transactions on Electron Devices*, No. 7, pp. 1484-1491 (2000).

Badenes et al, *A High Performance 0.18 um CMOS Technology Designed for Manufacturability*, 1997 Proc. 27th European Solid-State Device res. Conf. 404.

Badenes et al., Optimization of Critical Parameters in a Low Cost, High Performance Deep Submicron CMOS Technology, 1999 Proc. 29th European Solid-State Device Res. Conf. 628.

Borland, *Novel Device Structures by Selective Epitaxial Growth (SEG)*, 1987 Int'l Electron Devices Meeting Tech. Dig. 12.

Borland et al., Low Temperature Low Pressure Silicon Epitaxial Growth ad Its Application to Advanced Dielectric Isolation Technology, 1986 Extended Abstracts 18th Int'l Conf. on Solid State Devices and Materials 53 (1986).

Cao et al., "0.18μm Fully-Depleted Silicon-on-Insulator MOSFET's," *IEEE Electron Device Letters*, vol. 18, No. 6 (Jun. 1997), pp. 251-253.

Carns et al, Hole Mobility Measurements in Heavily Doped Si1-xGex Strained Layers, 41 *IEEE Transactions on Electron Devices* 1273 (1994).

C. Carter et al., Residual Defects Following Rapid Thermal Annealing of Shallow Boron and Boron Fluoride Implants into Preamorphized Silicon, 44 *Applied Physics Letters* 459 (1984).

Chau et al., "Advanced CMOS Transistors in the Nanotechnology Era for High-Performance, Low-Power Logic Applications," pp. 26-30 (2004).

Chieh et al., "Low-Resistance Bandgap-Engineered W/Si1-xGex/Si Contacts," *IEEE Electron Device Letters*, vol. 17, No. 7 (Jul. 1996) pp. 360-362.

Choi et al., "30nm ultra-thin body SOI MOSFET with selectively deposited Ge raised S/D," *58th Device Research Conference* (2000) pp. 23-24.

Choi et al., "Nanoscale Ultrathin Body PMOSFETs With Raised Selective Geranium Source/Drain," *IEEE Electron Device Letters*, vol. 22, No. 9 (Sep. 2001), pp. 447-448.

Corrected Request for *Ex Parte* Reexamination of U.S. Patent No. 6,703,688, Aug. 11, 2006.

Cowern et al., *Diffusion in Strained Si(Ge)*, 72 *Physical Review Letters* 2585 (1994).

Cressler, SiGe HBT Technology: A New Contender for Si-Based RF and Microwave Circuit Applications, 46 *IEEE Transactions on Microwave Theory and Tech.* 572 (1998).

Czaja, Conditions for the Generation of Slip by Diffusion of Phosphorus into Silicon, 37 J. Applied Physics 3441 (1996).

Daembkes et al., *The n-Channel SiGe/Si Modulation-Doped Field-Effect Transistor*, 33 *IEEE Transactions on Electron Devices* 633 (1986).

Detavemier et al., "CoSi2 Nucleation in the Presence of Ge," *Thin Solid Films*, vol. 384, No. 2 (2001), pp. 243-250.

Drowley et al., "Model for facet and sidewall defect formation during selective epitaxial growth of (001) silicon," *Applied Physics Letters*, 52 (7) (Feb. 15, 1988), pp. 546-548.

Eaglesham et al., "Growth Morphology and the Equilibrium Shape: The Role of 'Surfactants' in the Ge/Si Island Formation," *Physical Review Letters*, vol. 70, No. 7 (Feb. 15, 1993), pp. 966-969.

Eberhart et al., "Ni/Ag Metallization for SiGe HBTs using a Ni Silicide Contact," *Semiconductor Science and Technology*, vol. 16, No. 9, (2001) pp. L47-L49.

Eichinger et al., "Characterization of MBE Growth SiGe Superlattices with SIMS and RBS," Proceedings of the First International Symposium on Silicon Molecular Beam Epitaxy, 85(7):367-375(1985).

Endo et al., *Novel Device Isolation Technology with Selective Epitaxial Growth*, 1982 Int'l Electron Devices Meeting Tech. Dig. 241.

Endo et al., *Scaled CMOS Technology Using SEG Isolation and Buried Well Process*, 33 *IEEE Transactions on Electron Devices* 1659 (1986).

Fahey et al., *Point Defects and Dopant Diffusion in Silicon*, 61 Reviews of Modern Physics 289 (1989).

Fair, Boron Diffusion in Silicon-Concentrated and Orientation Dependence, Background Effects and Profile Estimation, 122 *J. Electrochemical Soc'y* 800 (1975).

Fair, "Concentration Profiles of Diffused Dopants in Silicon," *in* Impurity Doping Processes in Silicon, Chapt. 7, pp. 318-442 (1981).

Fair, "Quantified Conditions for Emitter-Misfit Dislocation Formation in Silicon," Journal of the Electrochemical Society, 125(6):923-926 (1978).

Fathy et al., "Formation of epitaxial layers of Ge on Si substrates by Ge implantation and oxidation," Applied Physics Letters, 51(17):1337-1339 (1987).

Fitch, Selectivity Mechanisms in Low Pressure Selective Epitaxial Silicon Growth, 141 *J. Electrochemical Soc'y* 1046 (1994).

Freiman et al., "Kinetics of Processes in the Ti-Si$_{1-x}$ Ge$_x$ Systems," *Applied Physics Letters* vol. 69, No. 25 (1996) pp. 3821-3823.

Freiman et al., "Titanium Metallization of Si-Ge Alloys and Superlattices," *Thin Solid Films*, vol. 294, No. 1-2 (1997) pp. 217-219.

Fuller et al., Diffusion of Donor and Acceptor Elements in Silicon, 27 J. Applied Physics 544 (1956).

Gallas et al., "Influence of doping on facet information at the SiO2/Si interface," *Surface Science*, 440 (1999), pp. 41-48.

Gaworzewski et al., Electrical Properties of Lightly Doped p-Type Silicon-Germanium Single Crystals, 83 J. Applied Physics 5258 (1998).

Ghani et al., "Effect of oxygen on minority-carrier lifetime and recombination currents in Si1-xGex heterostructure devices," Applied Physics letters, 58(12):1317-1319 (1991).

Gibbons et al., "Limited reaction processing: Silicon epitaxy," Applied Physics Letters, 47(7):721-723 (1985).

Glück et al., "CoSi2 and TiSi2 for Si/SiGe heterodevices," *Thin Solid Films*, vol. 270 (1995) pp. 549-554.

Godbey et al., "A Si0.7Ge0.3 Strained Layer Etch Stop for the Generation of Bond and Etch Back SOI," IEEE SOS/SOI Tech. Conf. Proc., pp. 143-144 (1989).

Goo et al., *Scalability of Strained-Si nMOSFETs Down nm Gate Length*, 24 *IEEE Electron Device Letters* 351 (2003).

Goulding, "The selective epitaxial growth of silicon," *Materials Science and Engineering*, B17 (1993), pp. 47-67.

Greve et al., "Growth Rate of Doped and Undoped Silicon by Ultra-High Vacuum Chemical Vapor Deposition," *Journal of the Electrochemical Society*, vol. 138, No. 6 (Jun. 1991), pp. 1744-1748.

Gronet et al., "Growth of GeSi/Si strained-layer superlattices using limited reaction processing," 61 J. Applied Physics, No. 6, pp. 2407-2409.

Gwoziecki et al., *Suitability of Elevated Source/Drain for Deep Submicron CMOS*, 1999 Proc. 29th European Solid-State Device Res. Conf. 384.

Harame et al., *A High Performance Epitaxial SiGe-Base ECL BiCMOS Technology*, 1992 Int'l Electron Devices Meeting Tech. Dig. 19.

Hobart et al., "Ultra-cut: A Simple Technique for the Fabrication of SOI Substrates with Ultra-Thin (<5 nm) Silicon Films," Proceedings 1998 IEEE International SOI Conference, pp. 145-146 (1998).

Holländer et al., "Reduction of Dislocation Density of MBE-Grown Si1-xGex Layers on (100) Si by Rapid thermal Annealing," Thin Solid Films, 183:157-164 (1989).

Hopkins et al., *Enhanced Diffusion in Boron Implanted Silicon*, 132 *Journal of the Electrochemical Society* 2035 (1985).

Hsiao et al., "Advanced Technologies for Optimized Sub-Quarter-Micrometer SOI CMOS Devices," *IEEE Transactions on Electron Devices*, vol. 45, No. 5 (1998) pp. 1092-1098.

Hu et al., "Channel and Source/Drain Engineering in High-Performance Sub-0.1 um NMOSFETs Using X-Ray Lithography," *1994 Symp. On VLSI Technology, Digest of Technical Papers* 17.

Huang et al., "SiGe-on-insulator prepared by wafer bonding and layer transfer for high-performance field-effect transistors," Applied Physics Letters, 78(9): 1267-1269 (2001).

Huang et al., "Electrical and Compositional Properties of Co-Silicided Shallow P+−n Junction Using Si-Capped/Boron-Doped Si1-xGex Layer Deposited by UHVCME," *Journal of the Electrochemical Society*, vol. 148, No. 3 (2001) pp. G126-C131.

Huang et al., N-Channel MOS Transistors Below 0.5 um with Ultra-Shallow Channels Formed by Low Temperature Selective Silicon Epitaxy, 387 Materials res. Soc'y Symp. Proc. 347 (1995).

Huang, et al., "Study on Ge/Si ration Silidation, and Starin Relaxation of High Temperature Sputtered Co/ Si1-x Gex Structures," 88 J. Applied Physics, No. 4, pp. 1831-1837 (2000).

Hull et al., "Structural Studies of GeSi/Si Heterostructures," Proceedings of the First International Symposium on Silicon Molecular Beam Epitaxy, 85(7):376-384 (1985).

Ilderem et al., "Very low pressure chemical vapor deposition process for selective tatanium silicide films," *Applied Physics Letters*, vol. 53, No. 8 (Aug. 22, 1988) pp.687-689.

Intel's Responses and Objections to AmberWave's Second Set of Interrogatories, U.S.D.C., District of Delaware, C.A. No. 05-301-KAJ, Feb. 3, 2006.

Intel's Responses and Objections to AmberWave's Second Set of Requests for Production, U.S.D.C., District of Delaware, C.A. No. 05-301-KAJ, Feb. 3, 2006.

Intel's Amended and Supplemental Responses and Objections to AmberWave's Second Set of Interrogatories, U.S.D.C., District of Delaware, C.A. No. 05-301-KAJ, Aug. 7, 2006.

International Search Report for International Patent Application No. PCT/US02/03688, dated May 7, 2002, 4 pages.

Ishitani et al., "Facet Formation in Selective Silicon Epitaxy Growth," *Japanese Journal of Applied Physics*, vol. 24, No. 10 (Oct., 1985), pp. 1267-1269.

Ishitani et al., "Local Loading Effect in Selective Silicon Epitaxy," 23 *Japanese Journal of Applied Physics* L391 (1984).

Ismail et al., "Extremely high electron mobility in Si/SiGe modulation-doped heterostructures," Applied Physics Letters, 66(9):1077-1079 (1995).

Ismail et al., "Identification of a Mobility-Limiting Scattering Mechanism in Modulation-Doped Si/SiGe Heterostructures," Physical Review letters, 73(25):3447-3452 (1994).

Ismail et al., "Gated Hall effect measurements in high-mobility n-type Si/SiGe modulation-doped heterostructures," Applied Physics Letters, 66(7):842-844 (1995).

Jain et al., Theoretical Calculations of the Fermi Level and of Other Parameters in Phosphorus Doped Silicon at Diffusion Temperatures, 21 *IEEE Transactions on Electron Devices* 155 (1974).

Jang et al., "Phosphorus doping of epitaxial Si and Si1-xGex at very low pressure," *Applied Physics Letters*, 63(12) (Sep. 20, 1993), pp. 493-526.

Jastrzebski, "SOI By CVD: Epitaxial Lateral Overgrowth (ELO) Process-review," *Journal of Crystal Growth*, 63 (1983), pp. 493-526.

Jungemann et al., "Full-Band Monte Carlo Simulation of a 0.12μ-Si-PMOSFET with and without a Strained SiGe-Channel," *IEEE Electron Devices Meeting*, 1998, pp. 897-900.

Karmins et al., "Kinetics of selective epitaxial deposition of Si1-xGex," *Applied Physics Letters*, 61 (6) (Aug. 10, 1992), pp. 669-671.

Kasper, "Growth and Properties of Si/SiGe Superlattices," Surface Science, 174L630-639 (1986).

Kato, The Annealing Time and Temperature Dependence of Eletrical Dopant Activation in High-Dose BF2 Ion Implanted Silicon, 141 *Journal of the Electrochemical Society* 3158 (1994).

Kandel et al., *Surfactant Mediated Crystal Growth of Semiconductors*, 75 *Physical Review Letters* 2742 (1995).

Kim et al., Properties of c-Axis-Oriented Freestanding GaN Substrates Prepared on Fused Silica Glass by Hydride Vapor Phase Epitaxy, 33 *Journal of the Korean Physical Society* L1 (1998).

King et al., "A Polycrystalline $Si_{1-x}Ge_x$ Gate CMOS Technology," IEEE, vol., No. 1990, pp. 253-256.

King et al., $Si/Si_{1-x}Ge_x$ Heterojunction Bipolar Transistors Produced by Limited Reaction Processing, 10 *IEEE Electron Device Letters* 52 (1989).

King, "Silicon-Germanium: from Microelectronics to Micromechanics," Presentation to the Thin Film Users Group Meeting, AVS Northern California Chapter, Apr. 17, 2002.

Kitajima et al., "Lattice Defect in Selective Epitaxial Silicon and Laterally Overgrown Regions on SiO2," *Journal of Crystal Growth*, 98 (1989), pp. 264-276.

Kitajima et al., *Crystalline Defects in Selectively Epitaxial Silicon Layers*, 22 *Japanese Journal of Applied Physics* L783 (1983).

Ku et al., "High Performance PMOSFETS With Ni(Si1-x Gex)/Poly-Si0.8Ge0.2 Gate," *IEEE-2000 Symposium on BLSI Technology, Digest of Technical Papers*, pp. 114-115 (2000).

Kuo, et al., Effects of Strain on Boron Diffusion in Si and $Si_{1-x}Ge_x$, 66 *Applied Physics Letters* 580 (1995).

Kurosawa et al., "A New Bird's Beak Free Field Isolation Technology for VLSI Devices," *IEDM Technical Digest*, Washington, D.C., Dec. 7-9, 1981, pp. 384-387.

Lai, J. B. et al., "Effects of Composition on the Formation Temperatures and Electrical Resistivities of C54 Titanium Germanosilicide in Ti- Si1-x Gex Systems," 86 J. Applied Physics, No. 3, pp. 1340-1345 (1999).

Langdo, "Selective SiGe Nanostructures," Ph.D. Thesis, Massachusetts Institute of Technology, 2001.

Lee et al., *High Quality Thin Epitaxial Silicon Layers Deposited Selectively by Rapid Thermal Processing*, 1989 Proc. Second Int'l Symp' on Ultra Large Scale Integration Sci. Tech. 233.

Li et al., "Modeling of facet growth on patterned Si substrate in gas source MBE," *Journal of Crystal Growth*, 157 (1995), pp. 185-189.

Lochtefeld, "Toward the End of the MOSFET Roadmap: Investigating Fundamental Transport Limits and Device Architecture Alternatives," Ph.D. Thesis, Massachusetts Institute of Technology, 2001.

Loechelt et al., "Measurement and Modeling of Boron Diffusion in Si and Strained $Si_{1-x}Ge_x$ Epitaxial Layers During Rapid Thermal Annealing," 74 J. Applied Physics 5520 (1993).

Lunnon et al., "Furnace and Rapid Thermal Annealing of P+/n Junctions in $BF_2^+$-Implanted Silicon," 132 *Journal of the Electrochemical Society* 2473 (1985).

Lynch, "Self-Aligned Contact Schemes for Source-Drains in Submicron Devices," *IEDM Technical Digest* (1987) pp. 354-357.

Maillard-Schaller et al. "Role of the substrate strain in the sheet resistance stability of NiSi deposited on Si(100)," 85 J. Applied Physics, No. 7, pp. 3614-3618 (Apr. 1, 1999).

Maleville et al., "Physical Phenomena Involved Involved in the Smart-Cut® Process," Electrochemical Society Proceedings, 96(3):34-46 (1996).

Maseeh et al., *Plastic Deformation of Highly Doped Silicon*, A21-A23 Sensors & Actuators 861 (1990).

Mazure et al., Facet Engineered Elevated Source/Drain by Selection Si Epitaxy for 0.35 Micron MOSFETS, 1992 *Int'l Electron Devices Meeting Tech. Dig.* 853.

Mehregany et al., *Anisotropic Etching of Silicon in Hydrazine*, 13 Sensors and Actuators 375 (1988).

Mercier et al., "Selective $TiSi_2$ Deposition with no Silicon Substrate Consumption by Rapid Thermal Processing in a LPCVD Reactor," *Journal of Electronic Materials*, vol. 19, No. 3 (1990) pp. 253-258.

Meyer, "Elevated Source/Drain Structures," *The ASM Epitaxy Newsletter of Continuous Improvement*, (Spring 1998) pp. 1-3.

Meyerson, "Low-Temperature Silicon Epitaxy by Ultrahigh Vacuum/Chemical Vapor Deposition," 48 *Applied Physics Letters* 797 (1986).

Meyerson et al., "Phosphorus-Doped PolyCrystalline Silicon via LPCVD," *Journal of the Electrochemical Society*, vol. 131, No. 10 (Oct. 1984), pp. 2366-2368.

Mieno et al., "Selective Doped Polysilicon Growth," 134 *Journal of the Electrochemical Society* 11, 2862-2867 (1987).

Mirabedini et al., Submicrometre Elevated Source and Drain MOSFET Technology Using E-Beam Evaporated Silicon, 33 *Electronics Letters* 1183 (1997).

Mistry et al., "Delaying Forever: Uniaxial Strained Silicon Transistors in a 90nm CMOS Technology," Symposium on VLSI Technology Digest of Technical Papers, pp. 50-51 (2004).

Miyake et al., Transient Enhanced Diffusion of Ion-Implanted Boron in Si During Rapid Thermal Annealing, 63 J. Applied Physics 1754 (1988).

Miyano et al., "Facet-Free Si Selective Epitaxial Growth Adaptable to Elevated Source/Drain MOSFETs with Narrow Shallow Trench Isolation," *Japanese Journal of Applied Physics*, vol. 38, Part 1, No. 4B (Apr. 1999), pp. 2419-2423.

Miyauchi et al., "Low-Temperature (850° C.) Silicon Selective Epitaxial Growth on HF-Treated Si (100) Subtartes Using SiH4-HCI-H2 Systems," 138 *Journal of the Electrochemical Society* 3480 (1991).

Mizuo et al., "Anomalous Diffusion of B and P in Si Directly Masked with $Si_3N_4$," 39 *Japanese Journal of Applied Physics* 281 (1982).

Moslehi et al., *Single-Wafer Integrated Semiconductor Device Processing*, 39 IEEE Transactions on Electron Devices 4 (1992).

Monroe et al., "Comparison of mobility-limiting mechanism in high-mobility Si1-xGex heterostructures," Journal of Vac. Sci. Technol. B, 11(4):1731-1737 (1993).

Moon et al., "Application of Interferometric broadband imaging alignment on an experimental x-ray stepper," *Journal of Vacuum Science and Technology, B* 16(6) (Nov./Dec. 1998), pp. 3631-3636.

Moriya et al., "Boron Diffusion in Strained $Si_{1-x}Ge_x$ Epitaxial Layers," 71 *Physical Review Letters* 883 (1993).

Moriya et al., "Doping and Electrical Characteristics of In Situ Heavily B-Doped $Si_{1-x}Ge_x$ Films Epitaxial;ly Grown Using Ultraclean LPCVD," 343-344 *Thin Solid Films* 541 (1999).

Murota et al., "CVD $Si_{1-x}Ge_x$ Epitaxial Growth and Its Doping Control," 27 *Journal of the Japanese Ass'n for Crystal Growth* 171 (2000).

Nakahara et al., Ultra-Shallow In-Situ-Doped Raised Source/Drain Structure for Sub-Tenth Micron CMOS, *1996 Symp. on VLSO Tech. Dig. Tech. Papers* 174.

Noble et al., "Reduction in misfit dislocation density by the selective growth of Si1-xGex/Si in small areas," Applied Physics Letters, 56(1):51-53 (1990).

Noda et al., "Doping and Electrical Characteristics of In-Situ Heavily B-Doped $Si_{1-x}Ge_xC_y$ Films Epitaxial Grown Using Ultraclean LPCVD," 380 *Thin Solid Films* 57 (2000).

Noh et al., "Contact Resistivity Between Tungsten and Impurity (P and B)-doped $Si_{1-x-y}Ge_xC_y$ Epitaxial Layer," 212-213 *Applied Surface Sci.* 679 (2003).

Okada et al., "Epitaxial Growth of Heavily B-Doped SiGe Films and Interfacial Reaction of Ti/B-Doped SiGe Bilayer Structure using Rapid Thermal Processing," *Thin Solid Films*, vol. 369, No. 1-2 (2000) pp. 130-133.

Osburn et al., "Low parasitic resistance contacts for scaled ULSI devices," *Thin Solid Films*, 332 (1998), pp. 428-436.

Oztürk et al., "Rapid Thermal Chemical Vapor Deposition of Germanium and Germanium/Silicon Alloys on Silicon: New Applications in the Fabrication of MOS Transistors," *Mat. Res. Soc. Symp. Proc.*, vol. 224 (1991) pp. 223-234.

Park et al., Analysis of Ion-Implanted Amorphous and Polycrystalline Silicon Films as Diffusion Sources for Ultrashallow Junctions, 70 J. Applied Physics 1397 (1991).

Patton et al., Silicon-Germanium-Base Heterojunction Bipolar Transistors by Molecular Beam Epitaxy, 9 *IEEE Electron Device Letters* 165 (1988).

Pfiester et al., Anomalous Co-Diffusion Effects of Germanium on Group III and V Dopants in Silicon, 52 *Applied Physics Letters* 471 (1988).

Pfiester et al., "A Self-Aligned Elevated Source/Drain MOSFET," *IEEE Electron Device Letters*, vol. 11, No. 9 (Sep. 1990), pp. 365-367.

Ponomarev et al., "High-Performance Deep SubMicron CMOS Technologies with Polycrystalline-SiGe Gates," *IEEE Transactions on Electron Devices*, vol. 47, No. 4, Apr. 2000, pp. 848-855.

Powell, "Activation of Shallow, High-Dose $BF_2^+$ Implants into Silicon by Rapid Thermal Processing," 56 J. Applied Physics 2837 (1984).

Prinz et al., "The Effects of Base Dopant Outdiffusion and Undoped $Si_{1-x}Ge_x$ Junction Spacer Layers in $Si/Si_{1-x}Ge_x/Si$ Heterojunction Bipolar Transistors," 12 *IEEE Electron Device Letters* 42 (1991).

Prinz et al., "The Effect of Base-Emmiter Spacers and Strain Dependent Densities of States in $Si/Si_{1-x}Ge_x/Si$ Heterojunction Bipolar Transistors," 1989 *Int'l Electron Devices Meeting Tech. Dig.* 639.

Qin, et al., "Structure and Thermal Stability of Ni/ $Si_{1-x}$ $Ge_x$ Contacts for VLSI Applications," *Electronics Letters*, vol. 36, No. 21 (Oct. 2000) pp. 1819-1821.

Raaijmakers et al., "Enabling technologies for forming and contacting shallow junctions in Si: HF-vapor cleaning and selective epitaxial growth of Si and SiGe," *Journal of Vacuum Science and Technology, B* 17(5) (Sep./Oct. 1999), pp. 2311-2320.

Ren et al., "A Novel Implantation Free Raised Source/Drain MOSFET Process Using Selective Rapid Thermal Chemical Vapor Deposition of In-Situ Boron Doped $Si_xGe_{1-x}$," *Mat. Res. Soc. Symp. Proc.*, vol. 303 (1993) pp. 37-41.

Request for *Ex Parte* Reexamination of U.S. Appl. No. 6,703,688, Jun. 2, 2006.

Reynolds et al., "Selective titanium disilicide by low-pressure chemical vapor deposition," 65 J. Applied Physics, No. 8, pp. 3212-3218 (Apr. 15, 1989).

Rim et al., Characteristics and Device Design of Sub-100 nm Strained Si N- and PMOSFETs, *2002 Symp. on VLSI Tech., Digest Tech. Papers* 98.

Rim et al., Low Field Mobility Characteristics of Sub-100 nm Unstrained and Strained Si MOSFETs, 2002 *Int'l Electron Devices Meeting Tech. Dig.* 43.

Rim et al., *Strained Si NMOSFETs for High Performance CMOS Technology*, 2001 *Symp. on VLSI Tech., Digest Tech. Papers* 59.

Rodder et al., "Raised Source/Drain MOSFET with Dual Sidewall Spacers," *IEEE Electron Device Letters*, vol. 12, No. 3 (Mar. 1991), pp. 89-91.

Rodrigues et al., "Strain Compensation by Heavy Boron Doping in $Si_{1-x}Ge_x$ Layers Grown by Solid Phase Epitaxy," 12 *J. Materials Res.* 1698 (1997).

Ryssel et al., High Concentration Effects of Ion Implanted Boron in Silicon, 22 *Applied Physics* 35 (1980).

Samavedam et al., "Elevated source drain devices using silicon selective epitaxial growth," *Journal of Vacuum Science and Technology, B* 18(3) (May/Jun. 2000), pp. 1244-1250.

Savina et al., "Faceting of a growing crystal surface by surface diffusion," *Physical Review*, E 67, 021606 (2003), pp. 1-16.

Schäffler, "Letter to the Editor, High-electron-mobility Si/SiGe heterostructures: influence of the relaxed SiGe buffer layer," Semicond. Sci. Technol., 7:260-266 (1992).

Schumann et al., *Impact of Elevated Source/Drain on the Reverse Short Channel Effect*, 1999 Proc. 29th European Solid-State Device Res. Conf. 572.

Sedgewick et al., "Growth of Facet-Free Selective Silicon Epitaxy at Low Temperature and Atmospheric Pressure," *Journal of the Electrochemical Society*, vol. 138, No. 10 (Oct. 1991), pp. 3042-3047.

Shibata et al., "High-Performance Half-Micron PMOSFETs with 0.1UM Shallow $P^+N$ Junction Utilizing Selective Silicon Growth and Rapid Thermal Annealing," *IEDM Technical Digest* (1987) pp. 590-593.

Shifren et al., "Drive current enhancement in p-type metal-oxide-semiconductor field-effect transistors under shear uniaxial stress," Applied Physics Letters, 85(25):6188-6190 (2004).

Sidek et al., "Reduction of parasitic bipolar transistor action and punchthrough susceptibility in MOSFETs using Si/Si1-xGex sources and drains," *Electronics Letters*, vol. 32, No. 3 (Feb. 1, 1996), pp. 269-270.

Simard-Normandin, "Electrical Characteristics and Contact resistance of $B^+$- and $BF_2^+$- Implanted Silicon Diodes with Furnace and Rapid Thermal Annealing," 32 *IEEE Transactions on Electron Devices* 1354 (1985).

Solmi et al., High-Concentration Boron Diffusion in Silicon: Simulation of the Precipitation Phenomena, 68 J. Applied Physics 3250 (1990).

Song et al., Facet Formation in Selectively Overgrown Silicon by Reduced Pressure Chemical Vapor Deposition, 1998 Dig. Papers Microprocesses and Nanotechnology '98 240.

Stach et al., *Anomalous Boron Diffusion in Silicon from Planar Boron Nitride Sources*, 121 *Journal of the Electrochemical Society* 722 (1974).

Stivers et al., *Growth Condition Dependence of SEG Planarity and Electrical Characteristics*, 1987 Proc. Tenth Int'l Conf. on Chemical Vapor Deposition 389.

Subbanna et al., "How SiGe Evolved into a Manufacturable Semiconductor Production Process," IEEE International Solid-State Circuits Conference, pp. 56, 67, 446 (1999).

Sugiyama et al., "Formation of strained-silicon layer on thin relaxed-SiGe/SiO2/Si structure using SIMOX technology," Thin Solid Films, 369:199-202 (2000).

Sun et al., "A Comparative Study of n+/p Junction Formation for Deep Submicron Elevated Source/Drain Metal Oxide Semiconductor Field Effect Transistors," *Journal of the Electrochemical Society*, vol. 144, No. 10 (Oct. 1997), pp. 3659-3664.

Sun et al., "The Effect of the Elevated Source/Drain Doping Profile on Performance and Reliability of Deep Submicron MOSFET's" *IEEE Transactions on Electron Devices*, vol. 44, No. 9 (Sep. 1997), pp. 1491-1498.

Sun et al., "Elevated $n^+/p$ Junctions by Implant into $CoSi_2$ Formed on Selective Epitaxy for Deep Submicron MOSFET's," *IEEE Transactions on Electron Devices* 1946 (1998).

Sun et al., "Impact of Epi Facets on Deep Submicron Elevated Source/Drain MOSFET Characteristics," *IEEE Transactions on Electron Devices*, vol. 45, No. 6 (Jun. 1998), pp. 1377-1380.

Sun et al., "Parasitic Resistance Considerations of Using Elevated Source/Drian Technology for Deep Submicron Metal Oxide Semiconductor Field Effect Transistors, 145 *Journal of the Electrochemical Society* 2131 (1998).

Suzuki et al., Effects of Si-Ge Buffer Layer for Low-temperature Si Epitaxial Growth on Si Substrate by rf Plasma Chemical Vapor Deposition, 54 J. Applied Physics 1466 (1983).

Tanno et al., *Selective Silicon Epitaxy Using Reduced Pressure Technique*, 21 *Japanese Journal of Applied Physics* L564 (1982).

Taraschi et al., "Strained-Si-on-Insulator (SSOI) and SiGe-on-Insulator (SGOI): Fabrication Obstacles and Solutions," Mat. Res. Soc. Symp. Proc., 745:105-110 (2003).

Taraschi et al., "Relaxed SiGe-on-insulator fabricated via wafer bonding and etch back," Journal of Vac. Sci. Technol. B, 20(2):725-727 (2002).

Taraschi et al., "Relaxed SiGe on Insulator Fabricated via Wafer Bonding and Layer Transfer: Etch-Back and Smart-Cut Alternatives," Electrochemical Society Proceedings, 2001(3):27-32 (2001).

Tromp et al., "Local Dimer Exchange in Surfactant-Mediated Epitaxial Growth," *Physical Review letters*, vol. 68, No. 7 (Feb. 17, 1992), pp. 954-957.

Tsai et al., "Recrystallization of Implanted Amorphous Silicon Layers. I. Electrical Properties of Silicon Implanted with $BF^+_2$ or $Si^+ + B^{+a}$)," 50 J. Applied Physics 183 (1979).

Uchino et al., "MOSFETs with Ultrashallow Junction and Minimum Drain Area Formed by Using Solid-Phase Diffusion from SiGe," *IEEE Transactions on Electron Devices*, vol. 48, No. 7 (Jul. 2001) pp. 1406-1411.

Uhrberg et al., "Electronic and atomic structure of arsenic terminated Si(100)," *Journal of Vacuum Science and Technology*, A 4 (3) (May/Jun. 1986), pp. 1259-1264.

van Dort et al., Influence of High Substrate Doping Levels on the Threshold Voltage and the Mobility of Deep-Submicrometer MOSFET's, 39 *IEEE Transactions on Electron Devices* 932 (1992).

van Meer et al., High Performance Raised Gate/Source/Drain Transistors for Sub-0.15 μm CMOS Technologies, 1999 Proc. 29th European Solid-State Device Res. Conf. 388.

van Oostrum et al., Characterization of Epitaxial Layers by the Depth Dependence of Boron Diffusivity, 61 *Applied Physics Letters* 1513 (1992).

Violette et al., "Facet-Free Selective Silicon Epitaxy by Reduced-Pressure Chemical Vapor Deposition: Process Evaluation and Impact on Shallow Trench Isolation," *Journal of the Electrochemical Society*, 146 (5) (1999), pp. 1895-1902.

Waite et al., *A Novel Deep Submicron Elevated Source/Drain MOSFET*, 1998 Proc. 28th European Solid-State Device Res. Conf. 148.

Walker et al., Shallow Boron Junctions and Preamorphization for Deep Submicron Silicon Technology, 73 J. Applied Physics 4048 (1993).

Wang, Identification and Measurement of Scaling-Dependent Parasitic Capacitances of Small-Geometry MOSFET's, 43 *IEEE Transactions on Electron Devices* 965 (1996).

Weldon et al., Raised Source-Drains Using Selective Silicon Deposition for Sub-Half Micron CMOS Devices, 94-2 *Extended Abstracts Fall Meeting Electrochemical Soc'y* 756 (1994).

Wong, *Beyond the Conventional Transistor*, 46 *IBM J. Res. & Dev.* 133 (2002).

Wong et al., "Elevated Source/Drain MOSFET," *IEDM Technical Digest*, 28 (1984), pp. 634-637.

Xiang et al., "Interfacet mass transport and facet evolution in selective epitaxial growth of Si by gas source molecular beam epitaxy," *Journal of Vacuum Science and Technology*, B 14(3) (May/Jun. 1996), pp. 2381-2386.

Yamakawa et al., Drivability Improvement on Deep-Submicron MOSFET's by Elevation of Source/Drain Regions, 20 *IEEE Electron Device Letters* 366 (1999).

Yasuda et al., "Interfacial Reactions of Ti / and Zr / $Si_{1-x}Ge_x$ / Si Contacts with Rapid Thermal Annealing," *Thin Solid Films*, vol./No. 373, 2000, pp. 73-78.

Yew, "Growth and Characterization of Low Temperature Silicon Selective Epitaxy," Ph.D. Thesis, Massachusetts Institute of Technology, 1990, pp. 1-210.

Yu et al., "Doping reaction of PH3 and B2H6 with Si(100)," 59 J. Applied Physics, No. 12, pp. 4032-4037, (Jun. 15, 1986).

König, "SiGe RF-Electronic: Devices, Circuits, Competitors, Markets," 533 Mat. res. Soc. Symp. Proc., pp. 3-17 (1998).

Rim et al., "Transconductance Enhancement in Deep Submicron Strained-Si*n*-MOSFETs," 1998 IEDM Tech. Dig., pp. 707-710.

Office action in *Ex Parte* Reexamination of U.S. Appl. No. 6,703,688, Mar. 12, 2007.

* cited by examiner

| TYPE OF SURFACE | AVERAGE ROUGHNESS (nm) |
|---|---|
| AS-GROWN GRADED COMPOSITION RELAXED SiGe | 7.9 |
| PLANARIZED SiGe | 0.57 |
| REGROWTH SiGe, LATTICE-MATCHED | ~0.6 |
| REGROWTH SiGe, LIGHT MISMATCH, THICKNESS = 1.5 μm | 0.77 |

FIG. 3

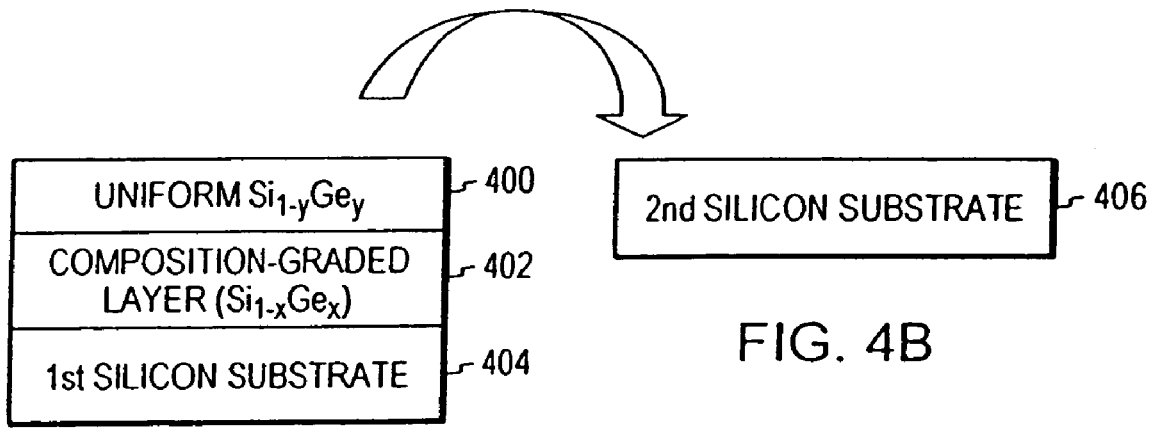
FIG. 4A
FIG. 4B
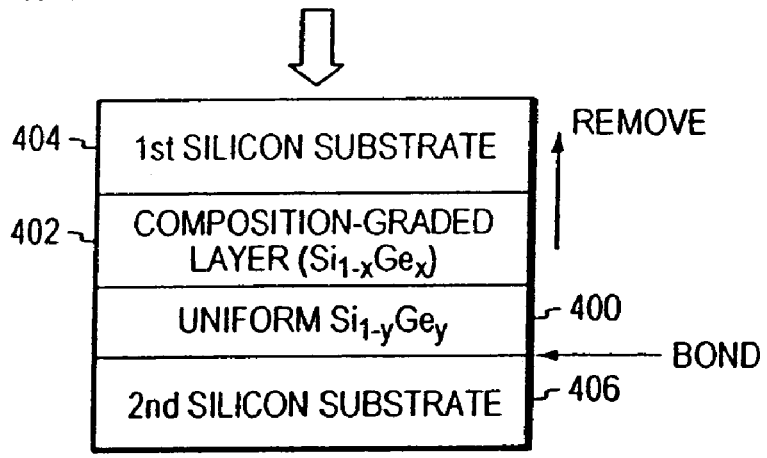
FIG. 4C
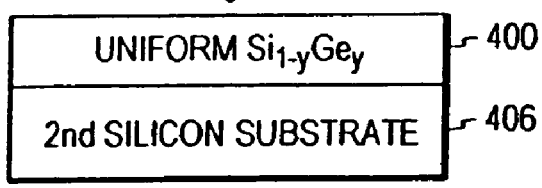
FIG. 4D

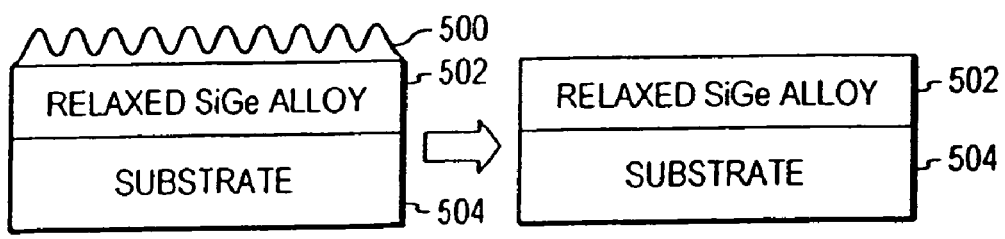
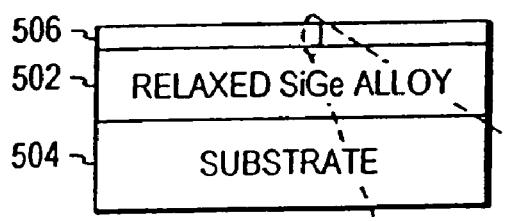
FIG. 5A
FIG. 5B
FIG. 5C
FIG. 5D

RELAXED SIGE PLATFORM FOR HIGH SPEED CMOS ELECTRONICS AND HIGH SPEED ANALOG CIRCUITS

PRIORITY INFORMATION

This application is a continuation of U.S. Ser. No. 10/774,890, filed Feb. 9, 2004, which is a continuation of U.S. Ser. No. 09/906,200, filed Jul. 16, 2001 now U.S. Pat. No. 6,703,688, which claims priority to and the benefit of U.S. Ser. No. 60/273,112, filed Mar. 2, 2001, the entire disclosure of each of these applications being incorporated herein by reference.

BACKGROUND OF THE INVENTION

The invention relates to the field of relaxed SiGe platforms for high speed CMOS electronics and high speed analog circuits.

Si CMOS as a platform for digital integrated circuits has progressed predictably through the industry roadmap. The progress is created through device miniaturization, leading to higher performance, greater reliability, and lower cost. However, new bottlenecks in data flow are appearing as the interconnection hierarchy is expanded. Although digital integrated circuits have progressed at unprecedented rates, analog circuitry has hardly progressed at all. Furthermore, it appears that in the near future, serious economic and technological issues will confront the progress of digital integrated circuits.

The digital and communication chip markets need an enhancement to Si CMOS and the maturing roadmap. One promising candidate material that improves digital integrated circuit technology and introduces new analog integrated circuit possibilities is relaxed SiGe material on Si substrates. Relaxed SiGe alloys on Si can have thin layers of Si deposited on them, creating tension in the thin Si layers. Tensile Si layers have many advantageous properties for the basic device in integrated circuits, the metal-oxide field effect transistor (MOSFET). First, placing Si in tension increases the mobility of electrons moving parallel to the surface of the wafer, thus increasing the frequency of operation of the MOSFET and the associated circuit. Second, the band offset between the relaxed SiGe and the tensile Si will confine electrons in the Si layer. Therefore, in an electron channel device (n-channel), the channel can be removed from the surface or 'buried'. This ability to spatially separate the charge carriers from scattering centers such as ionized impurities and the 'rough' oxide interface enables the production of low noise, high performance analog devices and circuits.

A key development in this field was the invention of relaxed SiGe buffers with low threading dislocation densities. The key background inventions in this area are described in U.S. Pat. No. 5,442,205 issued to Brasen et al. and U.S. Pat. No. 6,107,653 issued to Fitzgerald. These patents define the current best methods of fabricating high quality relaxed SiGe.

Novel device structures in research laboratories have been fabricated on early, primitive versions of the relaxed buffer. For example, strained Si, surface channel nMOSFETs have been created that show enhancements of over 60% in intrinsic $g_m$ with electron mobility increases of over 75% (Rim et al, IEDM 98 Tech. Dig. p. 707). Strained Si, buried channel devices demonstrating high transconductance and high mobility have also been fabricated (U. Konig, MRS Symposium Proceedings 533, 3 (1998)). Unfortunately, these devices possess a variety of problems with respect to commercialization. First, the material quality that is generally available is insufficient for practical utilization, since the surface of SiGe on Si becomes very rough as the material is relaxed via dislocation introduction. These dislocations are essential in the growth of relaxed SiGe layers on Si since they compensate for the stress induced by the lattice mismatch between the materials. For more than 10 years, researchers have tried to intrinsically control the surface morphology through epitaxial growth, but since the stress fields from the misfit dislocations affect the growth front, no intrinsic epitaxial solution is possible. The invention describes a method of planarization and regrowth that allows all devices on relaxed SiGe to possess a significantly flatter surface. This reduction in surface roughness increases the yield for fine-line lithography, thus enabling the manufacture of strained Si devices.

A second problem with the strained Si devices made to date is that researchers have been concentrating on devices optimized for very different applications. The surface channel devices have been explored to enhance conventional MOSFET devices, whereas the buried channel devices have been constructed in ways that mimic the buried channel devices previously available only in III–V materials systems, like AlGaAs/GaAs. Recognizing that the Si manufacturing infrastructure needs a materials platform that is compatible with Si, scalable, and capable of being used in the plethora of Si integrated circuit applications, the disclosed invention provides a platform that allows both the enhancement of circuits based on Si CMOS, as well as the fabrication of analog circuits. Thus, high performance analog or digital systems can be designed with this platform. An additional advantage is that both types of circuits can be fabricated in the CMOS process, and therefore a combined, integrated digital/analog system can be designed as a single-chip solution.

With these advanced SiGe material platforms, it is now possible to provide a variety of device and circuit topologies that take advantage of this new materials system. Exemplary embodiments of the invention describe structures and methods to fabricate advanced strained-layer Si devices, and structures and methods to create circuits based on a multiplicity of devices, all fabricated from the same starting material platform. Starting from the same material platform is key to minimizing cost as well as to allowing as many circuit topologies to be built on this platform as possible.

SUMMARY OF THE INVENTION

Accordingly, the invention provides a material platform of planarized relaxed SiGe with regrown device layers. The planarization and regrowth strategy allows device layers to have minimal surface roughness as compared to strategies in which device layers are grown without planarization. This planarized and regrown platform is a host for strained Si devices that can possess optimal characteristics for both digital and analog circuits. Structures and processes are described that allow for the fabrication of high performance digital logic or analog circuits, but the same structure can be used to host a combination of digital and analog circuits, forming a single system-on-chip.

BRIEF DESCRIPTION OF THE DRAWINGS

FIG. 3 is a table showing surface roughness data for relaxed SiGe buffers produced by dislocation injection via graded SiGe layers on Si substrates;

FIGS. 4A–4D show an exemplary process flow and resulting platform structure in accordance with the invention;

FIGS. 5A–5D are schematic diagrams of the corresponding process flow and layer structure for a surface channel FET platform in accordance with the invention;

DETAILED DESCRIPTION OF THE INVENTION

Figure 1:
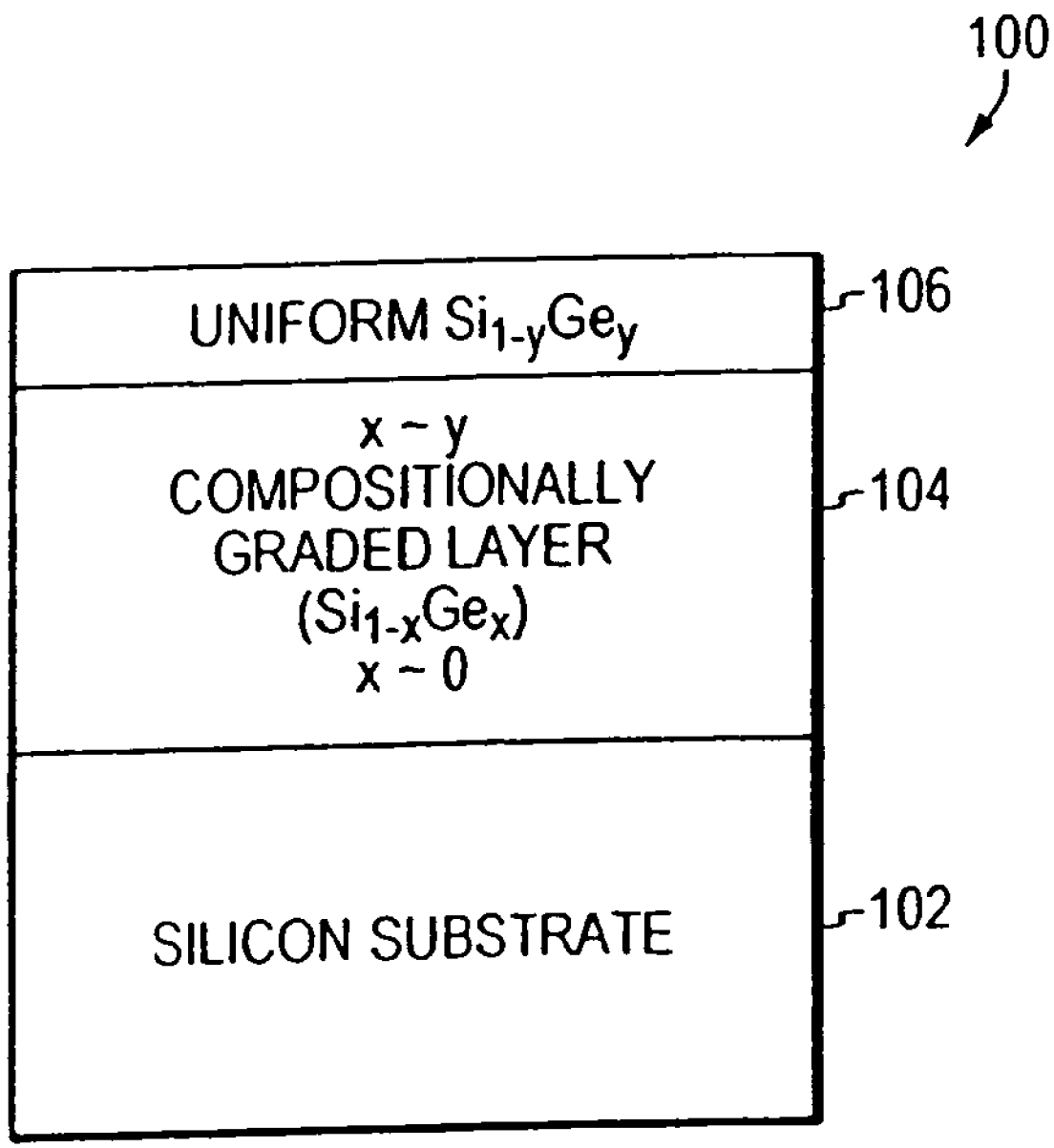
FIG. 1 is a schematic block diagram of a structure including a relaxed SiGe layer epitaxially grown on a Si substrate.

FIG. 1 is a schematic block diagram of a structure 100 including a relaxed SiGe layer epitaxially grown on a Si substrate 102. In this structure, a compositionally graded buffer layer 104 is used to accommodate the lattice mismatch between the uniform SiGe layer 106 and the Si substrate. By spreading the lattice mismatch over a distance, the graded buffer minimizes the number of dislocations reaching the surface and thus provides a method for growing high-quality relaxed SiGe films on Si.

Any method of growing a high-quality, relaxed SiGe layer on Si will produce roughness on the surface of the SiGe layer in a well-known crosshatch pattern. This crosshatch pattern is typically a few hundred angstroms thickness over distances of microns. Thus, the crosshatch pattern is a mild, undulating surface morphology with respect to the size of the electron or hole. For that reason, it is possible to create individual devices that achieve enhancements over their control Si device counterparts. However, commercialization of these devices requires injection of the material into the Si CMOS process environment to achieve low cost, high performance targets. This processing environment requires that the material and device characteristics have minimal impact on the manufacturing process. The crosshatch pattern on the surface of the wafer is one limiting characteristic of relaxed SiGe on Si that affects the yield and the ease of manufacture. Greater planarity is desired for high yield and ease in lithography.

Figure 2:
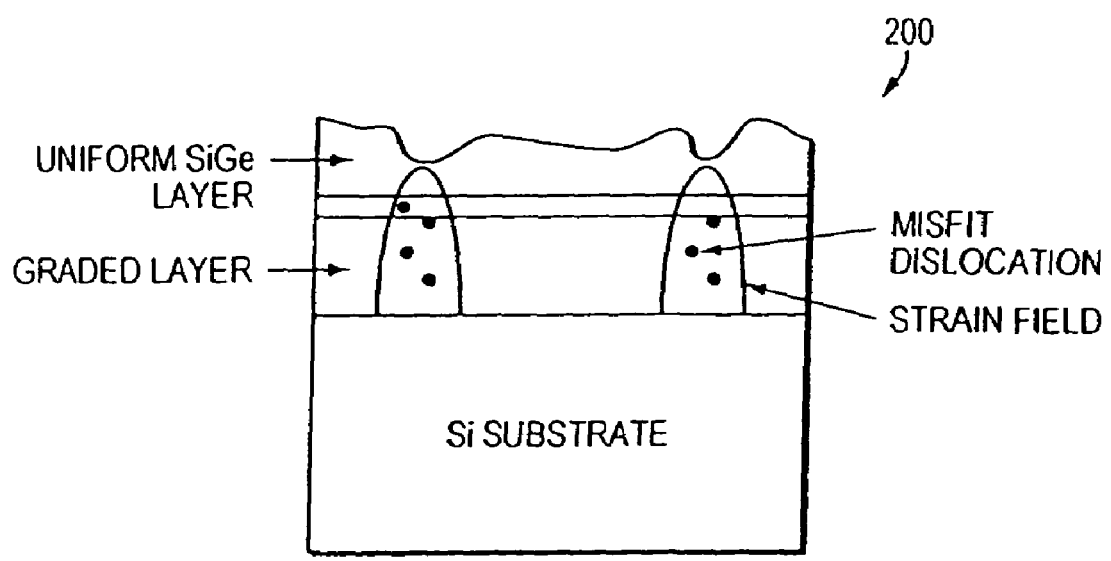
FIG. 2 is a schematic block diagram of an exemplary structure showing that the origin of the crosshatch pattern is the stress fields from injected misfit dislocations.

The origin of the crosshatch pattern is the stress fields from the injected misfit-dislocations. This effect is depicted by the exemplary structure 200 shown in FIG. 2. By definition, the dislocations must be introduced in order to accommodate the lattice-mismatch between the SiGe alloy and the Si substrate. The stress fields originate at the dislocations, and are terminated at the surface of the film. However, the termination at the surface creates crystal lattices that vary from place to place on the surface of the wafer. Since growth rate can be correlated to lattice constant size, different thicknesses of deposition occur at different points on the wafer. One may think that thick layer growth beyond the misfit dislocations will smooth the layer of these thickness differences. Unfortunately, the undulations on the surface have a relatively long wavelength; therefore, surface diffusion is typically not great enough to remove the morphology.

FIG. 3 is a table that displays surface roughness data for relaxed SiGe buffers produced by dislocation injection via graded SiGe layers on Si substrates. Note that the as-grown crosshatch pattern for relaxed $Si_{0.8}Ge_{0.2}$ buffers creates a typical roughness of approximately 7.9 nm. This average roughness increases as the Ge content in the relaxed buffer is increased. Thus, for any SiGe layer that is relaxed through dislocation introduction during growth, the surface roughness is unacceptable for state-of-the-art fabrication facilities. After the process in which the relaxed SiGe is planarized, the average roughness is less than 2 nm (typically 0.57 nm), and after device layer deposition, the average roughness is 0.77 nm with a 1.5 µm regrowth thickness. Therefore, after the complete structure is fabricated, over one order of magnitude of roughness reduction can be achieved.

The regrowth device layers can be either greater than or less than the critical thickness of the regrowth layer. In general, in any lattice-mismatched epitaxial growth, thin layers can be deposited without fear of dislocation introduction at the interface. At a great enough thickness, any lattice-mismatch between the film and substrate will introduce misfit dislocations into the regrown heterostructure. These new dislocations can cause additional surface roughness. Thus, if the lattice-mismatch between the regrowth device layers and relaxed SiGe buffer is too great, the effort of planarizing the relaxed SiGe may be lost since massive dislocation introduction will roughen the surface.

There are two distinct possibilities with respect to the regrowth thickness and the quality of surface. If the regrowth layers are very thin, then exact lattice matching of the regrowth layer composition and the relaxed buffer composition is not necessary. In this case, the surface roughness will be very low, approximately equal to the post-planarization flatness. However, in many applications for devices, the regrowth layer thickness will be 1–2 µm or more. For a 1% difference in Ge concentration between the relaxed SiGe and the regrowth layer, the critical thickness is approximately 0.5 µm. Thus, if optimal flatness is desired, it is best to keep the regrowth layer below approximately 0.5 µm unless excellent control of the uniformity of Ge concentration across the wafer is achieved. Although this composition matching is achievable in state-of-the-art tools, FIG. 3 shows that less precise matching, i.e., within 2% Ge, results in misfit dislocation introduction and introduction of a new crosshatch pattern. However, because the lattice mismatch is so small, the average roughness is still very low, approximately 0.77 nm. Thus, either lattice-matching or slight mismatch will result in excellent device layer surfaces for processing.

It is also noted that the relaxed SiGe alloy with surface roughness may not necessarily be a uniform composition relaxed SiGe layer on a graded composition layer. Although this material layer structure has been shown to be an early example of high quality relaxed SiGe, there are some disadvantages to this structure. For example, SiGe alloys possess a much worse coefficient of thermal conductivity than pure Si. Thus, for electronic devices located at the surface, it may be relatively difficult to guide the heat away from the device areas due to the thick graded composition layer and uniform composition layer.

Another exemplary embodiment of the invention, shown in FIGS. 4A–4D, solves this problem and creates a platform for high power SiGe devices. FIGS. 4A–4D show an exemplary process flow and resulting platform structure in accordance with the invention. The structure is produced by first forming a relaxed uniform SiGe alloy 400 via a compositionally graded layer 402 on a Si substrate 404. The SiGe layer 400 is then transferred to a second Si substrate 406 using conventional bonding. For example, the uniform SiGe alloy 400 on the graded layer 402 can be planarized to remove the crosshatch pattern, and that relaxed SiGe alloy can be bonded to the Si wafer. The graded layer 402 and the original substrate 404 can be removed by a variety of conventional processes. For example, one process is to grind the original Si substrate away and selectively etch to the SiGe, either by a controlled dry or wet etch, or by embedding an etch stop layer. The end result is a relaxed SiGe alloy 400 on Si without the thick graded layer. This structure is more suited for high power applications since the heat can be conducted away from the SiGe layer more efficiently.

The bond and substrate removal technique can also be used to produce SiGe on insulator substrates, or SGOI. An SGOI wafer is produced using the same technique shown in FIGS. 4A–4D; however, the second substrate is coated with a SiO$_2$ layer before bonding. In an alternative embodiment, both wafers can be coated with SiO$_2$ to enable oxide-to-oxide bonding. The resulting structure after substrate removal is a high quality, relaxed SiGe layer on an insulating film. Devices built on this platform can utilize the performance enhancements of both strained Si and the SOI architecture.

It will be appreciated that in the scenario where the SiGe layer is transferred to another host substrate, one may still need to planarize before regrowing the device layer structure. The SiGe surface can be too rough for state of the art processing due to the substrate removal technique. In this case, the relaxed SiGe is planarized, and the device layers are regrown on top of the high-quality relaxed SiGe surface.

Figures 6A, 6B:
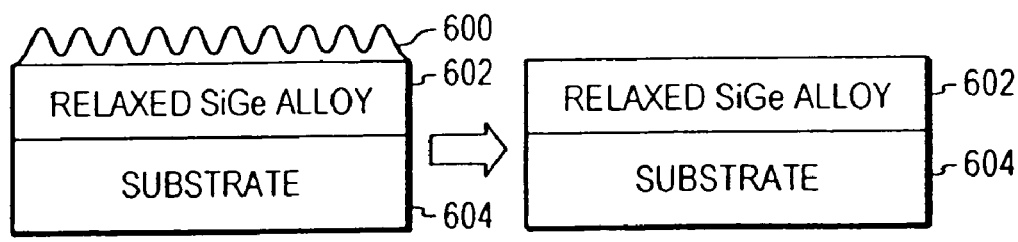
FIGS. 6A–6D are schematic diagrams of the corresponding process flow and layer structure for a buried channel FET platform in accordance with the invention.
Figure 6C:
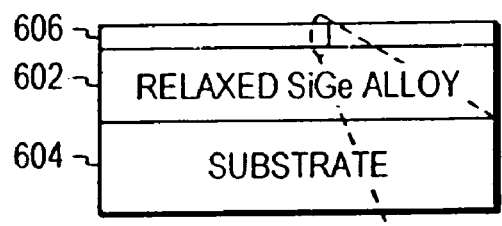
Figure 6D:
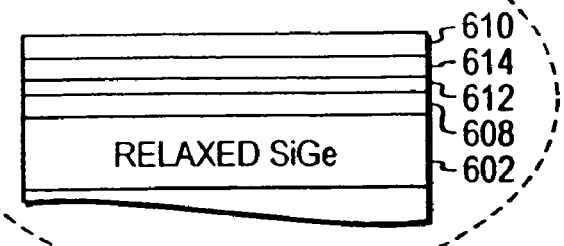

Planarization of the surface via mechanical or other physical methods is required to flatten the surface and to achieve CMOS-quality devices. However, the field effect transistors (FETs) that allow for enhanced digital and analog circuits are very thin, and thus would be removed by the planarization step. Thus, a first part of the invention is to realize that relaxed SiGe growth and planarization, followed by device layer regrowth, is key to creating a high-performance, high yield enhanced CMOS platform. FIGS. 5 and 6 show the process sequence and regrowth layers required to create embodiments of surface channel and buried channel FETs, respectively.

FIGS. 5A–5D are schematic diagrams of a process flow and resulting layer structure in accordance with the invention. FIG. 5A shows the surface roughness 500, which is typical of a relaxed SiGe alloy 502 on a substrate 504, as an exaggerated wavy surface. Note that the substrate is labeled in a generic way, since the substrate could itself be Si, a relaxed compositionally graded SiGe layer on Si, or another material in which the relaxed SiGe has been transferred through a wafer bonding and removal technique. The relaxed SiGe alloy 502 is planarized (FIG. 5B) to remove the substantial roughness, and then device regrowth layers 506 are epitaxially deposited (FIG. 5C). It is desirable to lattice-match the composition of the regrowth layer 506 as closely as possible to the relaxed SiGe 502; however, a small amount of mismatch and dislocation introduction at the interface is tolerable since the surface remains substantially planar. For a surface channel device, a strained Si layer 508 of thickness less than 0.1 µm is then grown on top of the relaxed SiGe 502, i.e., the strain-inducing material, with an optional sacrificial layer 510, as shown in FIG. 5D. The strained layer 508 is the layer that will be used as the channel in the final CMOS devices.

FIGS. 6A–6D are schematic diagrams of the corresponding process flow and layer structure for a buried channel FET platform in accordance with the invention. In this structure, the regrowth layers 606 include a lattice matched SiGe layer 602, a strained Si channel layer 608 with a thickness of less than 0.05 µm, a SiGe separation or spacer layer 612, a Si gate oxidation layer 614, and an optional sacrificial layer 610 used to protect the heterostructure during the initial device processing steps.

Figure 7A:
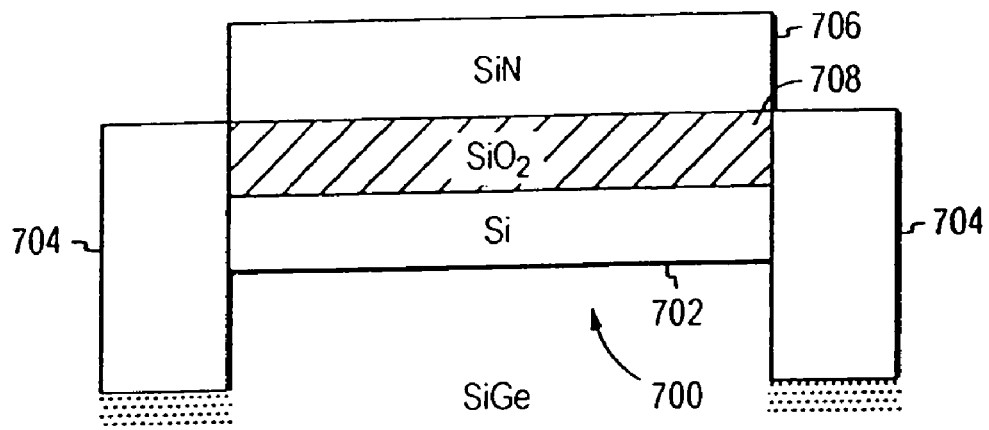
FIGS. 7A–7D are schematic diagrams of a process flow for a surface channel MOSFET in accordance with the invention.
Figure 7B:
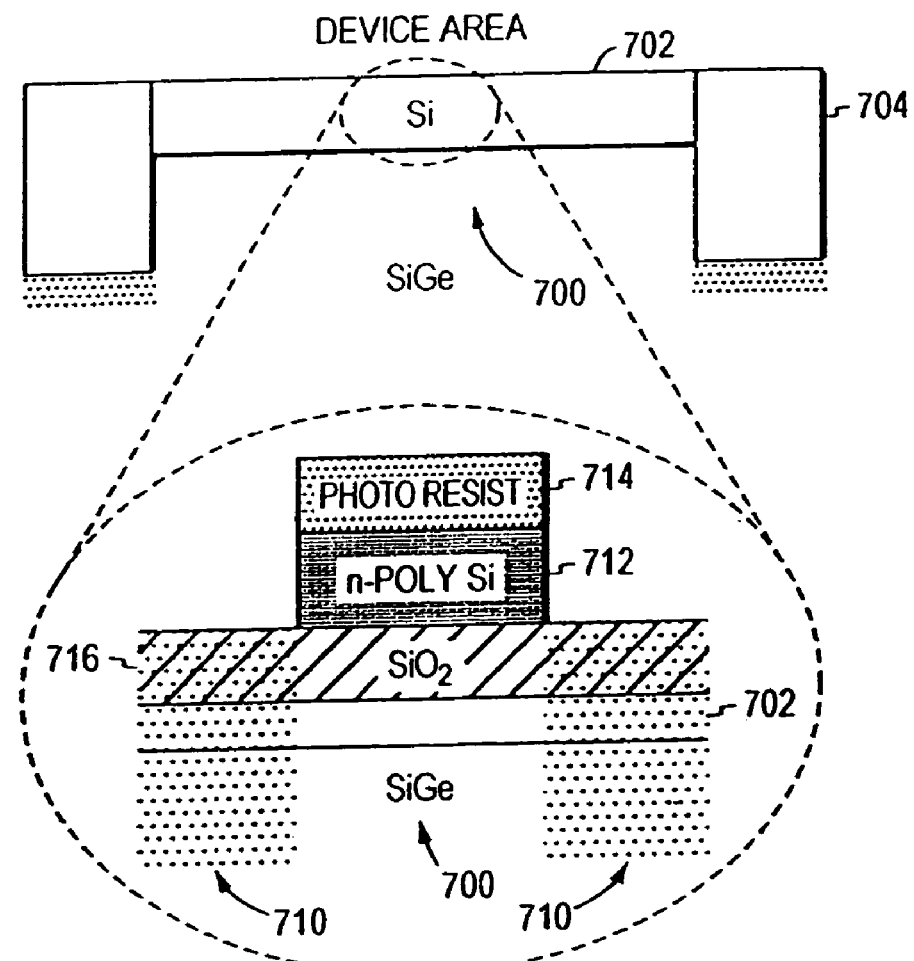
Figure 7C:
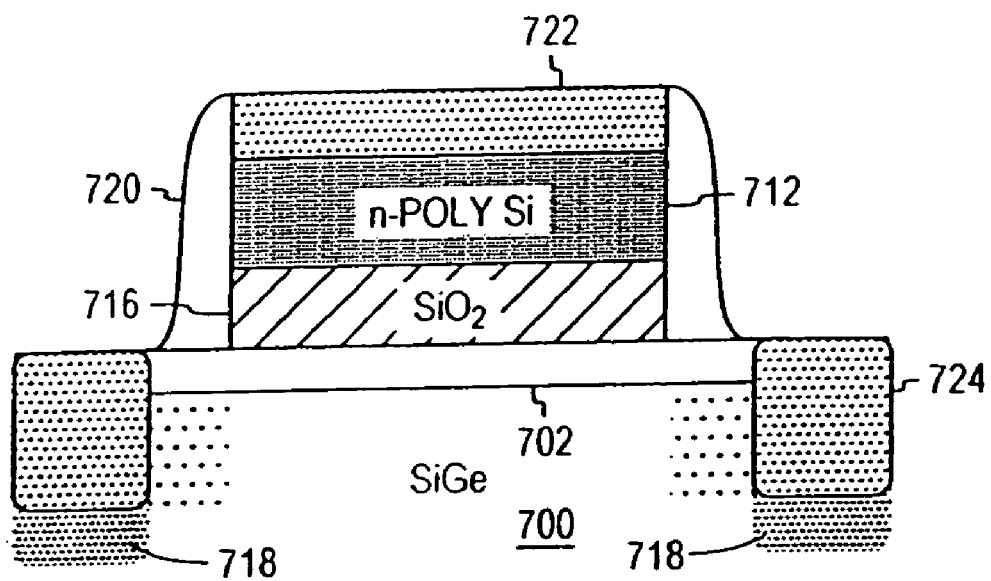
Figure 7D:
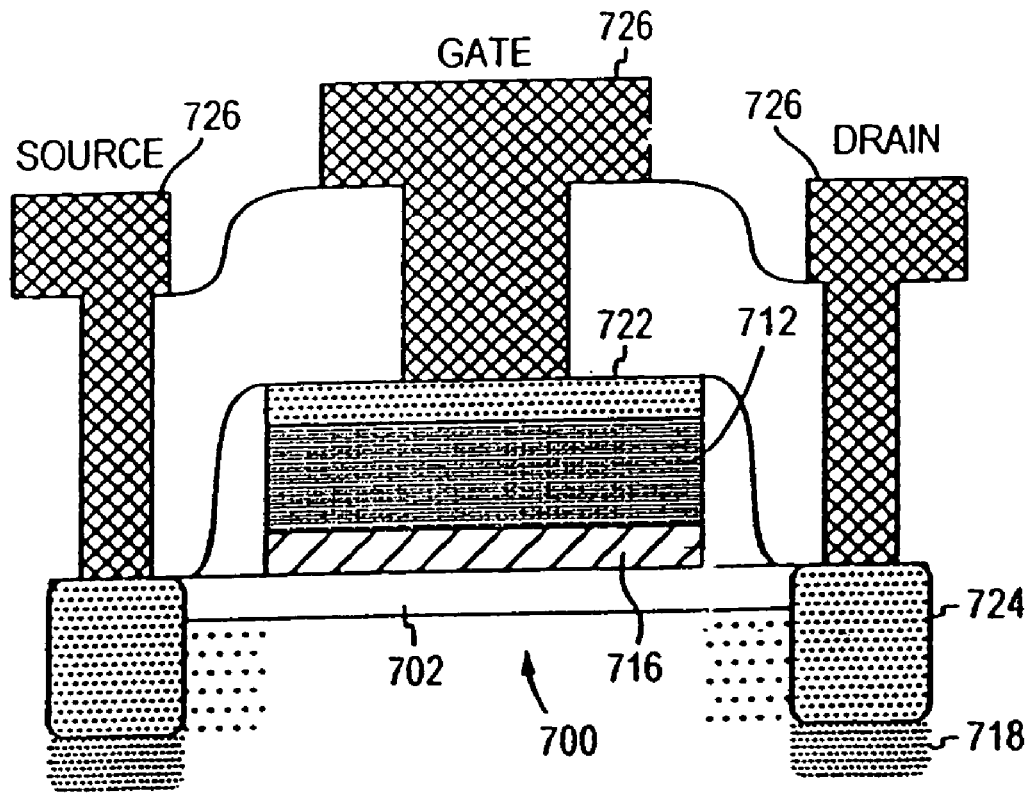

Once the device structure has been deposited, the rest of the process flow for device fabrication is very similar to that of bulk Si. A simplified version of the process flow for a surface channel MOSFET in accordance with the invention is shown in FIGS. 7A–7D. This surface channel MOSFET contains a relaxed SiGe layer 700, i.e., the strain-inducing material, and a strained Si layer 702. The device isolation oxide 704, depicted in FIG. 7A, is typically formed first. In this step, the SiN layer 706, which is on top of a thin pad oxide layer 708, serves as a hard mask for either local oxidation of silicon (LOCOS) or shallow trench isolation (STI). Both techniques use a thick oxide (relative to device dimensions) to provide a high threshold voltage between devices; however, STI is better suited for sub-quarter-micron technologies. FIG. 7B is a schematic of the device area after the gate oxide 716 growth and the shallow-source drain implant. The implant regions 710 are self-aligned by using a poly-Si gate 712 patterned with photoresist 714 as a masking layer. Subsequently, deep source-drain implants 718 are positioned using conventional spacer 720 formation and the device is electrically contacted through the formation of silicide 722 at the gate and silicide/germanides 724 at the source and drain (FIG. 7C). FIG. 7D is a schematic of the device after the first level of metal interconnects 726 have been deposited and etched.

Since there are limited-thickness layers on top of the entire structure, the removal of surface material during processing becomes more critical than with standard Si. For surface channel devices, the structure that is regrown consists primarily of nearly lattice-matched SiGe, and a thin surface layer of strained Si. Many of the processes that are at the beginning of a Si fabrication sequence strip Si from the surface. If the processing is not carefully controlled, the entire strained Si layer can be removed before the gate oxidation. The resulting device will be a relaxed SiGe channel FET and thus the benefits of a strained Si channel will not be realized.

A logical solution to combat Si removal during initial processing is to make the strained Si layer thick enough to compensate for this removal. However, thick Si layers are not possible for two reasons. First, the enhanced electrical properties originate from the fact that the Si is strained and thick layers experience strain relief through the introduction of misfit dislocations. Second, the misfit dislocations themselves are undesirable in significant quantity, since they can scatter carriers and increase leakage currents in junctions.

Figure 8A:
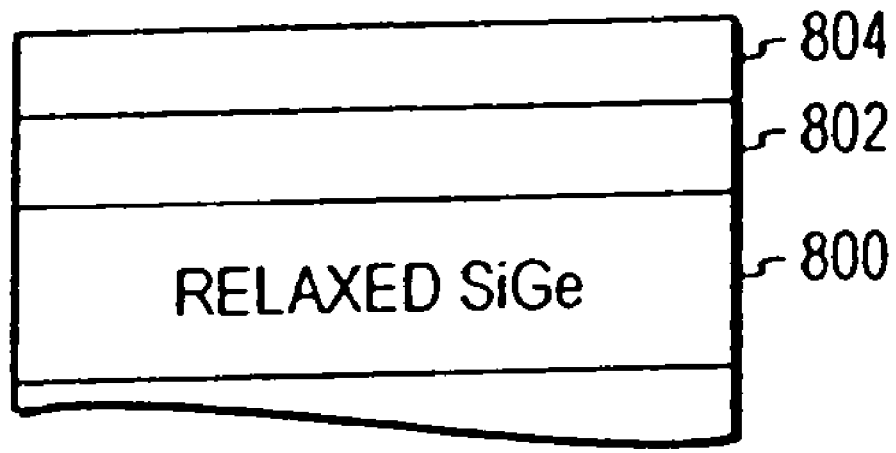
FIGS. 8A and 8B are schematic block diagrams of surface channel devices with protective layers.
Figure 8B:
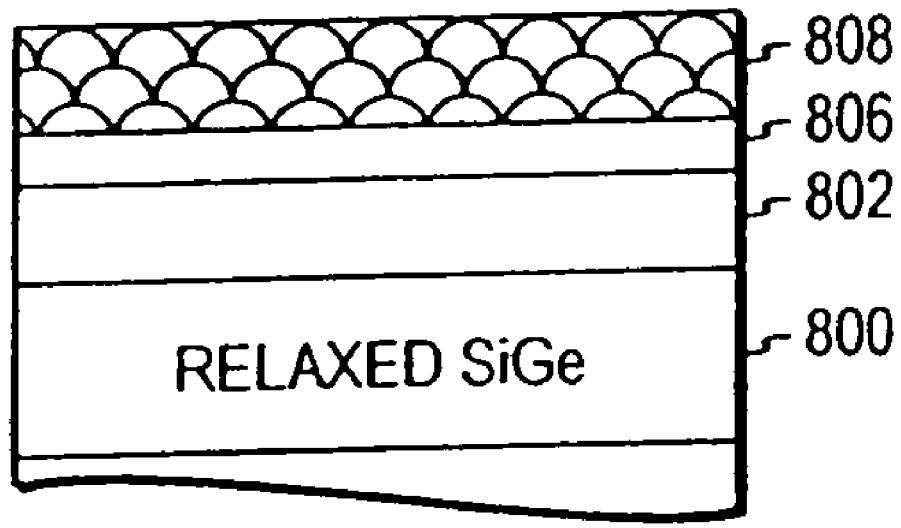

In order to prevent removal of strained Si layers at the surface, the cleaning procedures before gate oxidation must be minimized and/or protective layers must be applied. Protective layers are useful since their removal can be carefully controlled. Some examples of protective layers for surface channel devices are shown in FIGS. 8A and 8B. FIG. 8A shows a strained Si heterostructure of a relaxed SiGe layer 800 and a strained Si channel layer 802 protected by a surface layer 804 of SiGe. The surface SiGe layer 804 should have a Ge concentration similar to that of the relaxed SiGe layer 800 below, so that the thickness is not limited by critical thickness constraints. During the initial cleans, the SiGe sacrificial layer is removed instead of the strained Si channel layer. The thickness of the sacrificial layer can either be tuned to equal the removal thickness, or can be made greater than the removal thickness. In the latter case, the excess SiGe can be selectively removed before the gate oxidation step to reveal a clean, strained Si layer at the as grown thickness. If the particular fabrication facility prefers a Si terminated surface, a sacrificial Si layer may be deposited on top of the SiGe sacrificial cap layer.

FIG. 8B shows a structure where a layer 806 of $SiO_2$ and a surface layer 808 of either a poly-crystalline or an amorphous material are used as protective layers. In this method, an oxide layer is either grown or deposited after the epitaxial growth of the strained Si layer. Subsequently, a polycrystalline or amorphous layer of Si, SiGe, or Ge is deposited. These semiconductor layers protect the strained-Si layer in the same manner as a SiGe cap during the processing steps before gate oxidation. Prior to gate oxidation, the poly/amorphous and oxide layers are selectively removed. Although the sacrificial layers are shown as protection for a surface channel device, the same techniques can be employed in a buried channel heterostructure.

Another way in which conventional Si processing is modified is during the source-drain silicide-germanide formation (FIG. 7C). In conventional Si processing, a metal (typically Ti, Co, or Ni) is reacted with the Si and, through standard annealing sequences, low resistivity suicides are formed. However, in this case, the metal reacts with both Si and Ge simultaneously. Since the silicides have much lower free energy than the germanides, there is a tendency to form a silicide while the Ge is expelled. The expelled germanium creates agglomeration and increases the resistance of the contacts. This increase in series resistance offsets the benefits of the extra drive current from the heterostructure, and negates the advantages of the structure.

Ti and Ni can form phases in which the Ge is not rejected severely, thus allowing the formation of a good contact. Co is much more problematic. However, as discussed above for the problem of Si removal, a protective layer(s) at the device epitaxy stage can be applied instead of optimizing the SiGe-metal reaction. For example, the strained Si that will become the surface channel can be coated with a high-Ge-content SiGe alloy (higher Ge content than the initial relaxed SiGe), followed by strained Si. Two approaches are possible using these surface contact layers. Both methods introduce thick Si at the surface and allow the conventional silicide technology to be practiced without encountering the problems with SiGe-metal reactions.

Figure 9A:
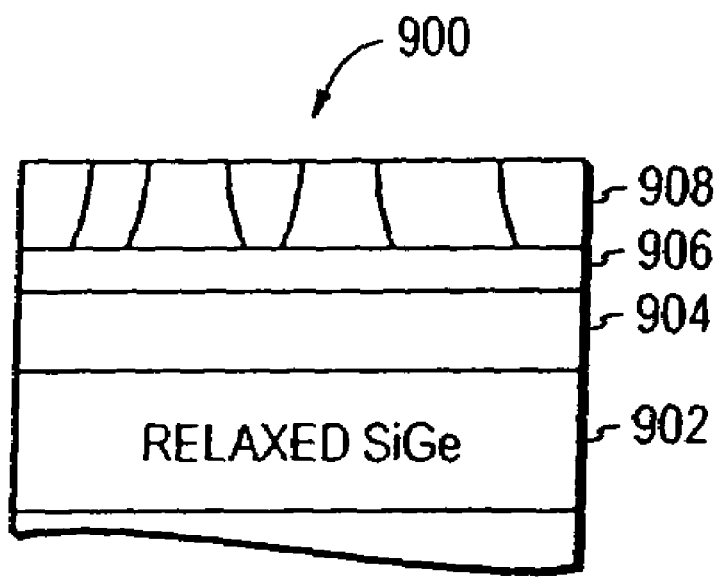
FIGS. 9A and 9B are schematic block diagrams of surface channel devices with Si layers on Ge-rich layers for use in silicide formation.

The first approach, shown on a surface channel heterostructure 900 in FIG. 9A, uses a Ge-rich layer 906 thin enough that it is substantially strained. The layer 906 is provided on a strained Si channel layer 904 and relaxed SiGe layer 902, i.e., the strain-inducing material. In this case, if a subsequent Si layer 908 is beyond the critical thickness, the compressive Ge-rich layer 906 acts as a barrier to dislocations entering the strained Si channel 904. This barrier is beneficial since dislocations do not adversely affect the silicide process; thus, their presence in the subsequent Si layer 908 is of no consequence. However, if the dislocations were to penetrate to the channel, there would be adverse effects on the device.

Figure 9B:

A second approach, shown in FIG. 9B, is to allow a Ge-rich layer 910 to intentionally exceed the critical thickness, thereby causing substantial relaxation in the Ge-rich layer. In this scenario, an arbitrarily thick Si layer 912 can be applied on top of the relaxed Ge-rich layer. This layer will contain more defects than the strained channel, but the defects play no role in device operation since this Si is relevant only in the silicide reaction. In both cases, the process is free from the metal-SiGe reaction concerns, since the metal will react with Si-only. Once the silicide contacts have been formed, the rest of the sequence is a standard Si CMOS process flow, except that the thermal budget is carefully monitored since, for example, the silicide-germanicide (if that option is used) typically cannot tolerate as high a temperature as is the conventional silicide. A major advantage of using Si/SiGe FET heterostructures to achieve enhanced performance is the compatibility with conventional Si techniques. Many of the processes are identical to Si CMOS processing, and once the front-end of the process, i.e., the processing of the Si/SiGe heterostructure, is complete, the entire back-end process is uninfluenced by the fact that Si/SiGe lies below.

Figure 10:
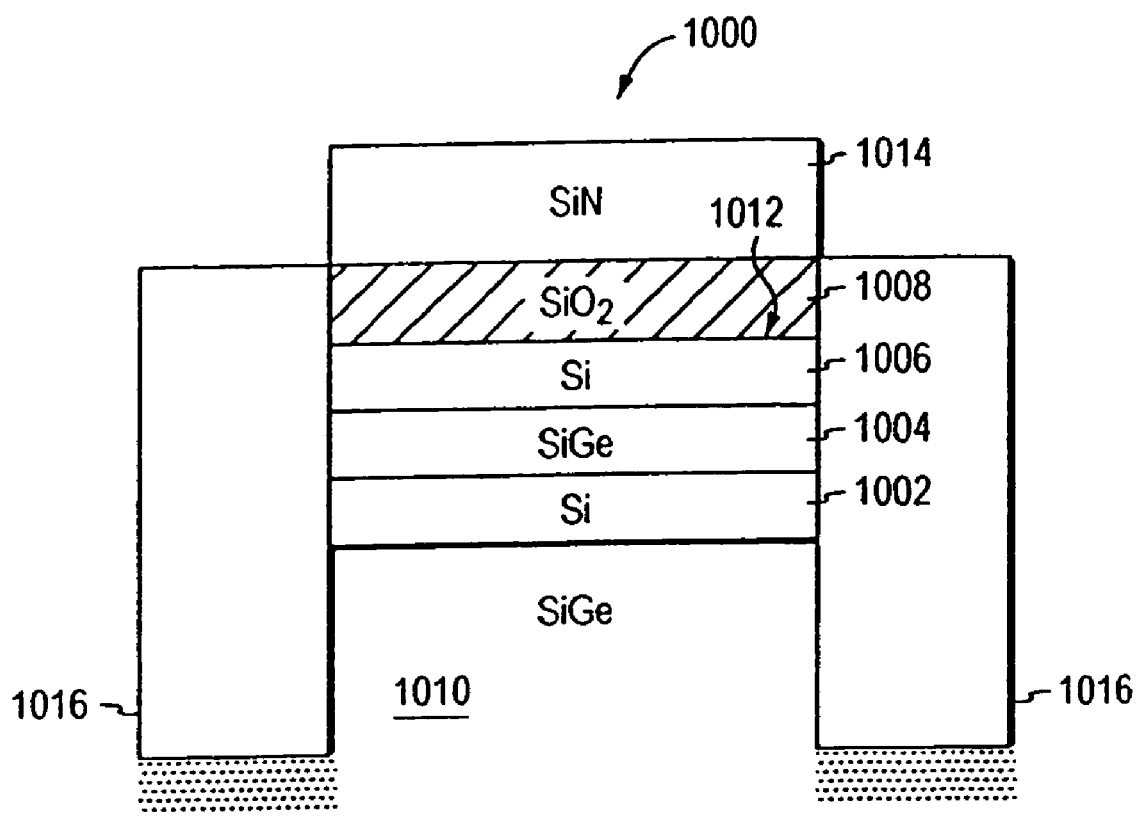
FIG. 10 is schematic diagram of a buried channel MOSFET after device isolation in accordance with the invention.

Even though the starting heterostructure for the buried channel device is different from that of the surface channel device, its process flow is very similar to the surface channel flow shown in FIGS. 7A–7D. FIG. 10 is a schematic block diagram of a buried channel MOSFET structure 1000 after the device isolation oxide 1016 has been formed using a SiN mask 1014. In this case, the strained channel 1002 on a first SiGe layer 1010 is separated from the surface by the growth of another SiGe layer 1004, followed by another Si layer 1006. This Si layer is needed for the gate oxide 1008 since gate-oxide formation on SiGe produces a very high interface state density, thus creating non-ideal MOSFETs. One consequence of this Si layer, is that if it is too thick, a substantial portion of the Si layer will remain after the gate oxidation. Carriers can populate this residual Si layer, creating a surface channel in parallel with the desired buried channel and leading to deleterious device properties. Thus, the surface layer Si must be kept as thin as possible, typically less than 50 Å and ideally in the range of 5–15 Å.

Another added feature that is necessary for a buried channel device is the supply layer implant. The field experienced in the vertical direction when the device is turned on is strong enough to pull carriers from the buried channel 1002 and force them to populate a Si channel 1006 near the $Si/SiO_2$ interface 1012, thus destroying any advantage of the buried channel. Thus, a supply layer of dopant must be introduced either in the layer 1004 between the buried channel and the top Si layer 1006, or below the buried channel in the underlying SiGe 1010. In this way, the device is forced on with little or no applied voltage, and turned off by applying a voltage (depletion mode device).

Figure 11:
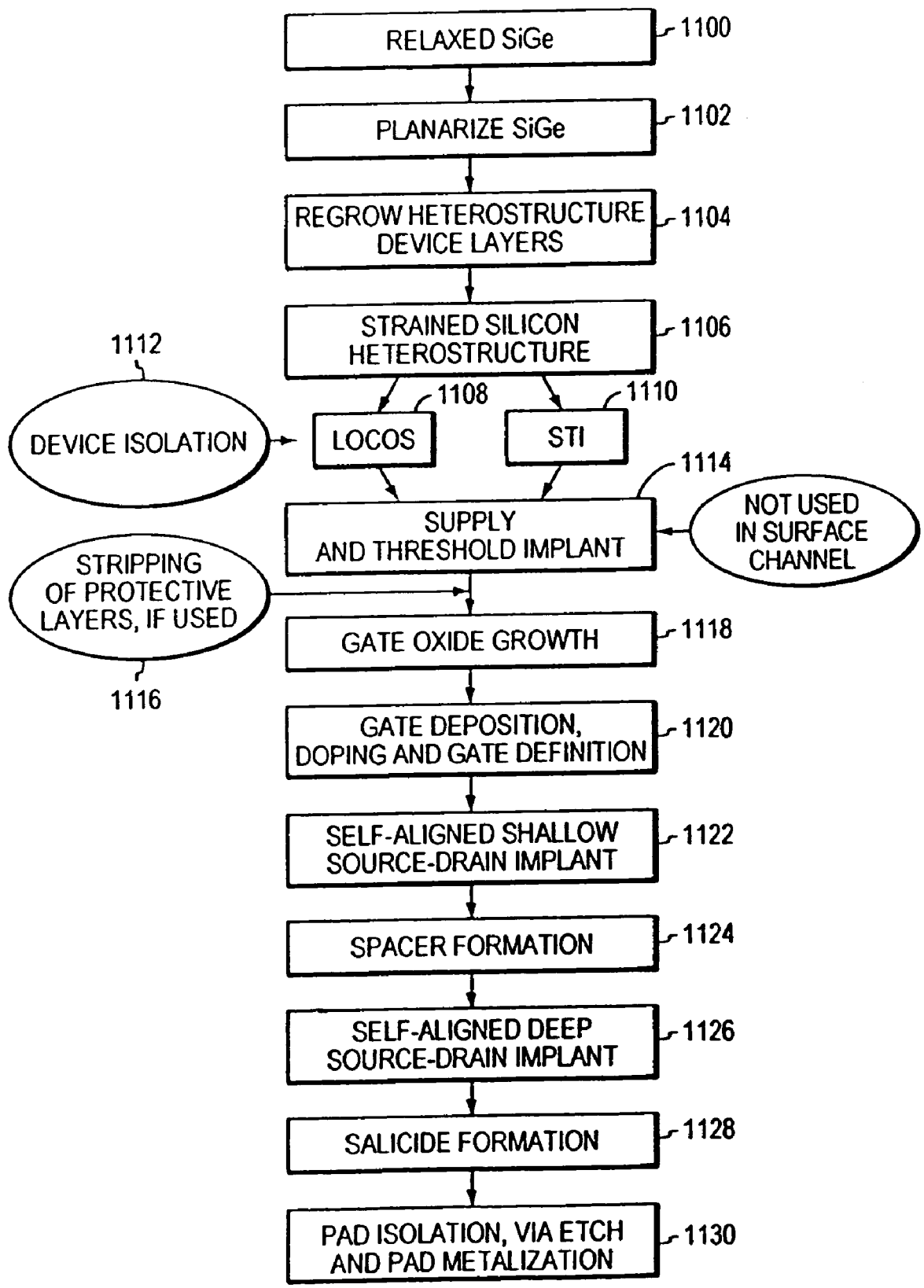
FIG. 11 is a schematic flow of the process, for any heterostructure FET device deposited on relaxed SiGe, in accordance with the invention.

FIG. 11 is a schematic flow of the process, for any heterostructure FET device deposited on relaxed SiGe, in accordance with the invention. The main process steps are shown in the boxes, and optional steps or comments are shown in the circles. The first three steps (1100,1102,1104) describe the fabrication of the strained silicon heterostructure. The sequence includes production of relaxed SiGe on Si, planarization of the SiGe, and regrowth of the device layers. Once the strained heterostructure is complete (1106), MOS fabrication begins with device isolation (1112) using either STI (1110) or LOCOS (1108). Before proceeding to the gate oxidation, buried channel devices undergo a supply and threshold implant (1114), and any protective layers applied to either a buried or surface channel heterostructure must be selectively removed (1116). The processing sequence after the gate oxidation (1118) is similar to conventional Si CMOS processing. These steps include gate deposition, doping, and definition (1120), self-aligned shallow source-drain implant (1122), spacer formation (1124), self-aligned deep source-drain implant (1126), salicide formation (1128), and pad isolation via metal deposition and etch (1130). The steps requiring significant alteration have been discussed.

One particular advantage of the process of FIG. 11 is that it enables the use of surface channel and buried channel devices on the same platform. Consider FIGS. 12A–12D and FIGS. 13A–13D, which show a universal substrate layer configuration and a process that leads to the co-habitation of surface and buried channel MOSFETs on the same chip. The universal substrate is one in which both surface channel and buried channel devices can be fabricated. There are two possibilities in fabricating the surface channel device in this sequence, shown in FIGS. 12 and 13. The process flows for combining surface and buried channel are similar to the previous process described in FIG. 7. Therefore, only the critical steps involved in exposing the proper gate areas are shown in FIGS. 12 and 13.

Figure 12A:
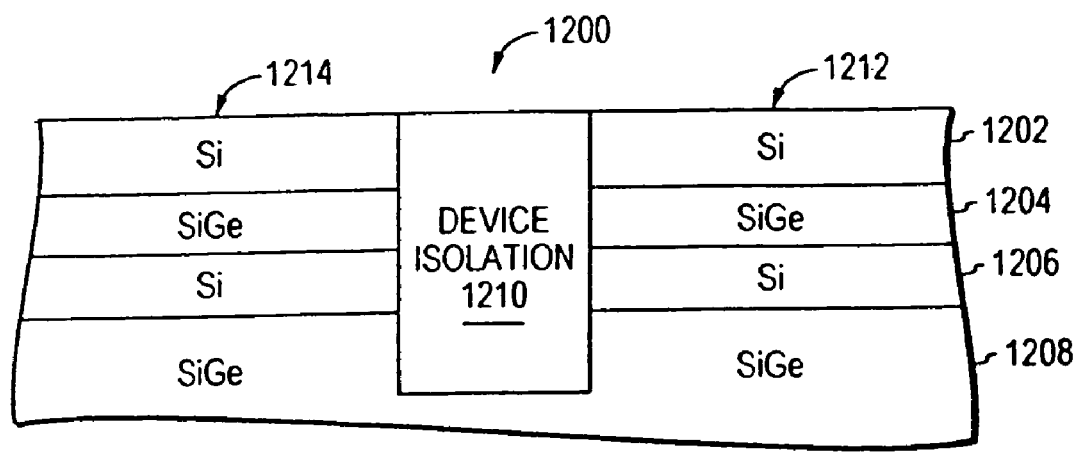
FIGS. 12A–12D are schematic diagrams of a process flow in the case of forming the surface channel MOSFET in the top strained Si layer in accordance with the invention.
Figure 13A:
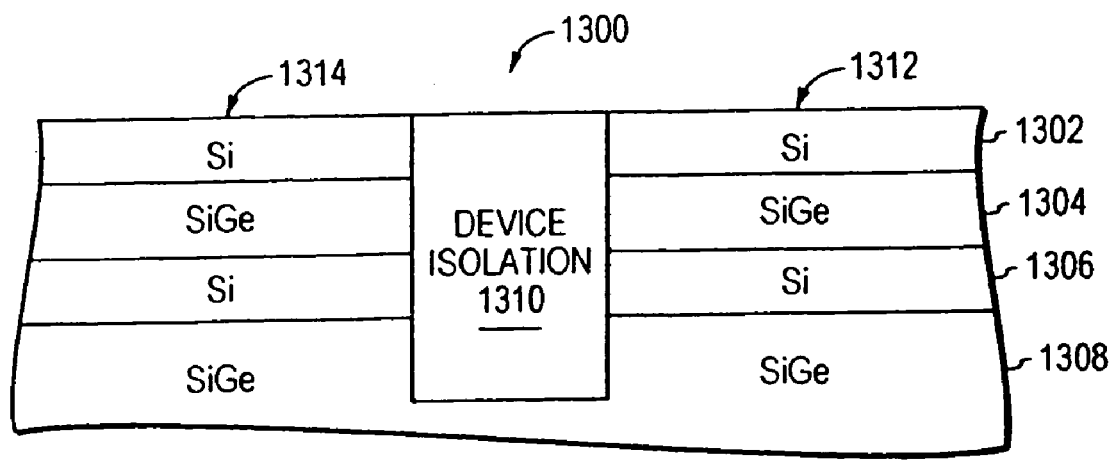
FIGS. 13A–13D are schematic diagrams of a process flow in the case of forming the surface channel MOSFET in the buried strained Si layer in accordance with the invention.

FIGS. 12A and 13A depict the same basic heterostructure 1200,1300 for integrating surface channel and buried channel devices. There is a surface strained Si layer 1202,1302, a SiGe spacer layer 1204,1304, a buried strained Si layer 1206,1306, and a relaxed platform of SiGe 1208,1308. Two strained Si layers are necessary because the buried channel MOSFET requires a surface Si layer to form the gate oxide and a buried Si layer to form the device channel. The figures also show a device isolation region 1210 that separates the buried channel device area 1212,1312 from the surface channel device area 1214,1314.

Figure 12B:
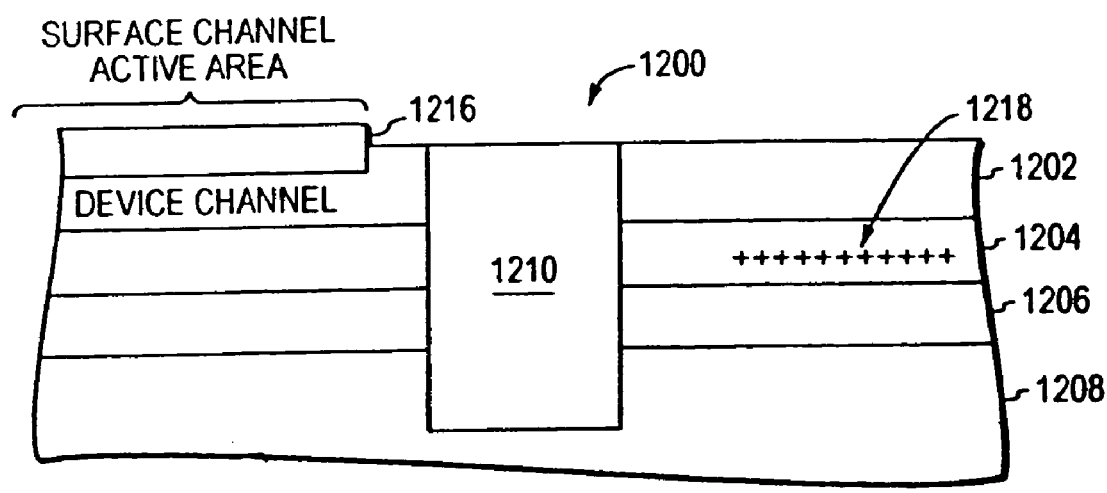
Figure 12C:
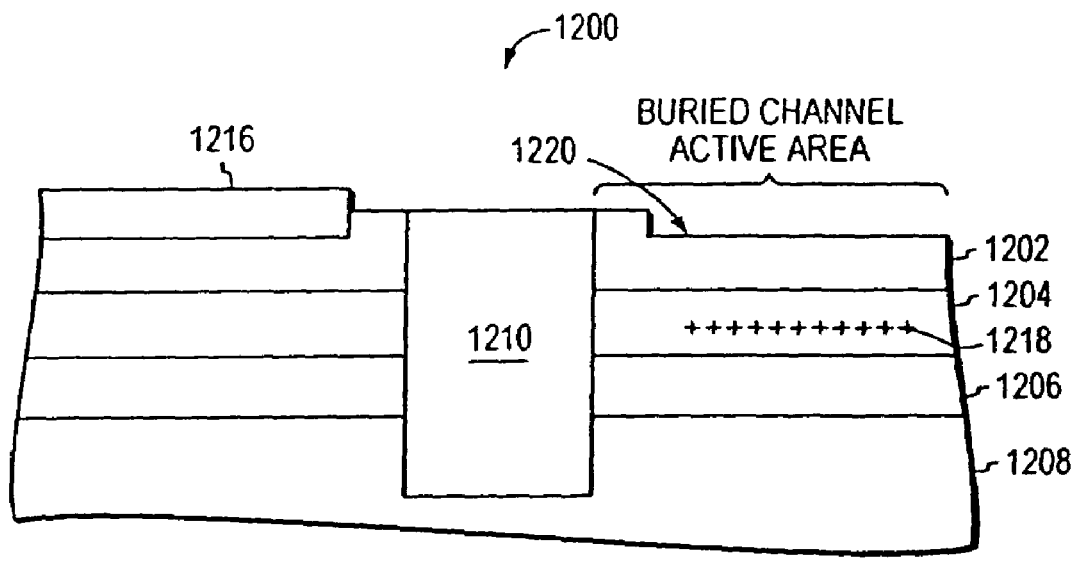
Figure 12D:
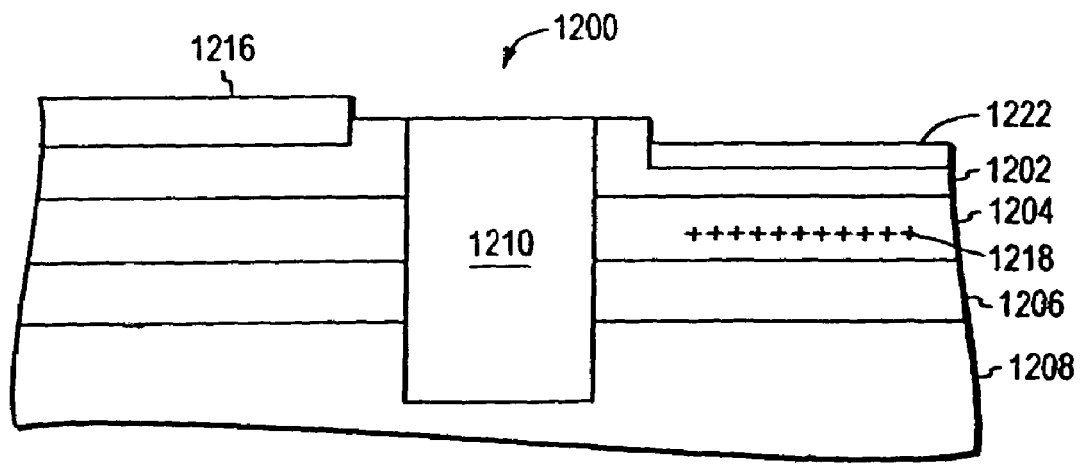
Figure 13B:
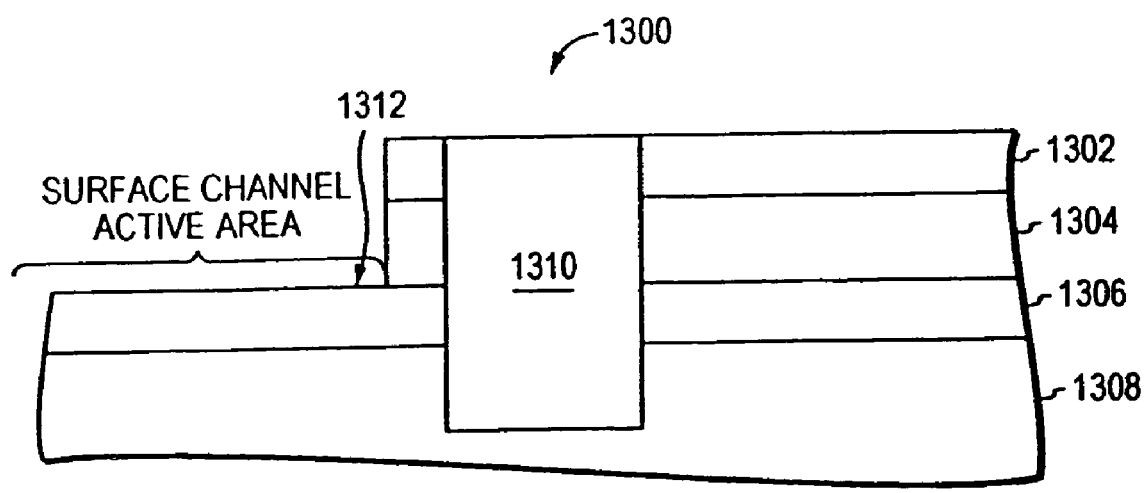
Figure 13C:
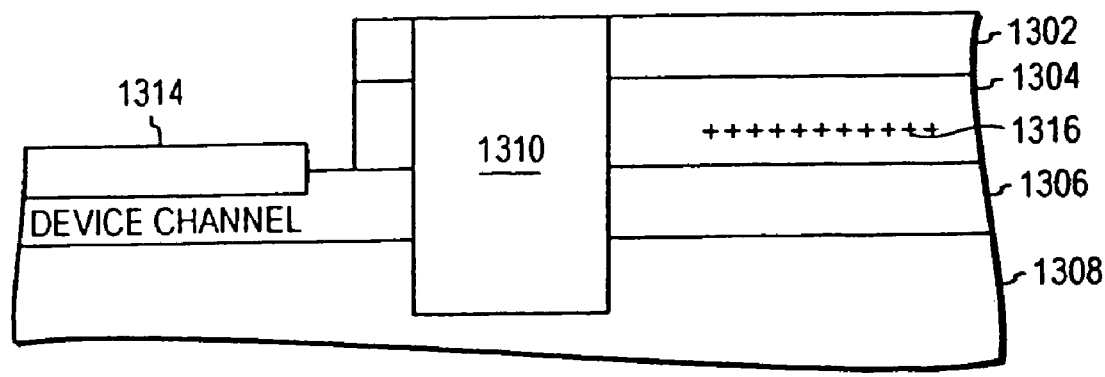
Figure 13D:
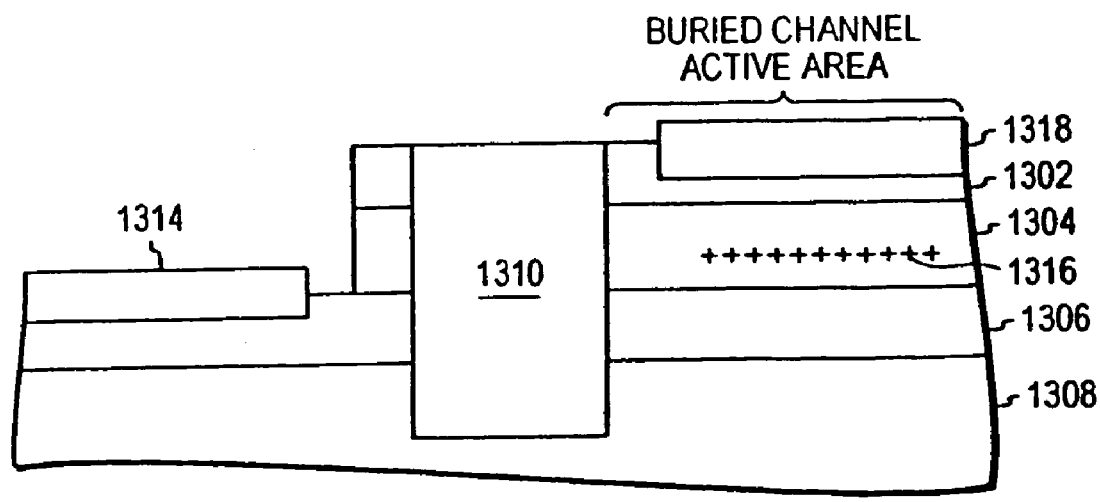

Unlike the buried channel device, a surface channel MOSFET only requires one strained Si layer. As a result, the surface channel MOSFET can be fabricated either in the top strained Si layer, as shown in FIGS. 12B–12D, or the buried Si layer channel, as shown in FIGS. 13B–13D. FIG. 12B is a schematic diagram of a surface channel gate oxidation 1216 in the top Si layer 1202. In this scenario, a thicker top Si layer is desired, since after oxidation, a residual strained Si layer must be present to form the channel. FIG. 12B also shows a possible position for the buried channel supply implant 1218, which is usually implanted before the buried channel gate oxide is grown. Since the top Si layer is optimized for the surface channel device, it may be necessary to strip some of the top strained Si in the regions 1220 where buried channel devices are being created, as shown in FIG. 12C. This removal is necessary in order to minimize the surface Si thickness after gate oxide 1222 formation (FIG. 12D), and thus avoid the formation of a parallel device channel.

When a surface channel MOSFET is formed in the buried strained Si layer, the top strained Si layer can be thin, i.e., designed optimally for the buried channel MOSFET. In FIG. 13B, the top strained Si and SiGe layers are removed in the region 1312 where the surface channel MOSFETs are formed. Because Si and SiGe have different properties, a range of selective removal techniques can be used, such as wet or dry chemical etching. Selective oxidation can also be used since SiGe oxidizes at much higher rates than Si, especially under wet oxidation conditions. FIG. 13C shows the gate oxidation 1314 of the surface channel device as well as the supply layer implant 1316 for the buried channel device. Finally, FIG. 13D shows the position of the buried channel gate oxide 1318. No thinning of the top Si layer is required prior to the oxidation since the epitaxial thickness is optimized for the buried channel device. Subsequent to these initial steps, the processing for each device proceeds as previously described.

Another key step in the process is the use of a localized implant to create the supply layer needed in the buried channel device. In a MOSFET structure, when the channel is turned on, large vertical fields are present that bring carriers to the surface. The band offset between the Si and SiGe that confines the electrons in the buried strained Si layer is not large enough to prevent carriers from being pulled out of the buried channel. Thus, at first, the buried channel MOSFET would appear useless. However, if enough charge were present in the top SiGe layer, the MOSFET would become a depletion-mode device, i.e. normally on and requiring bias to turn off the channel. In the surface/buried channel device platform, a supply layer implant can be created in the regions where the buried channel will be fabricated, thus easing process integration. If for some reason the supply layer implant is not possible, note that the process shown in FIG. 11 in which the surface channel is created on the buried Si layer is an acceptable process, since the dopant can be introduced into the top SiGe layer during epitaxial growth. The supply layer is then removed from the surface channel MOSFET areas when the top SiGe and strained Si layers are selectively etched away.

In the processes described in FIGS. 10, 12 and 13, it is assumed that the desire is to fabricate a buried channel MOSFET. If the oxide of the buried channel device is removed, one can form a buried channel device with a metal gate (termed a MODFET or HEMT). The advantage of this device is that the transconductance can be much higher since there is a decrease in capacitance due to the missing oxide. However, there are two disadvantages to using this device. First, all thermal processes after gate definition have to be extremely low temperature, otherwise the metal will react with the semiconductor, forming an alloyed gate with a very low, or non-existent, barrier. Related to this issue is the second disadvantage. Due to the low thermal budget, the source and drain formation and contacts are typically done before the gate definition. Inverting these steps prevents the gate from being self-aligned to the source and drain, thus increasing the series resistance between the gate and the source and drain. Therefore, with a carefully designed buried channel MOSFET, the self-aligned nature can be a great advantage in device performance. Another benefit of the MOSFET structure is that the gate leakage is very low.

Figure 14A:
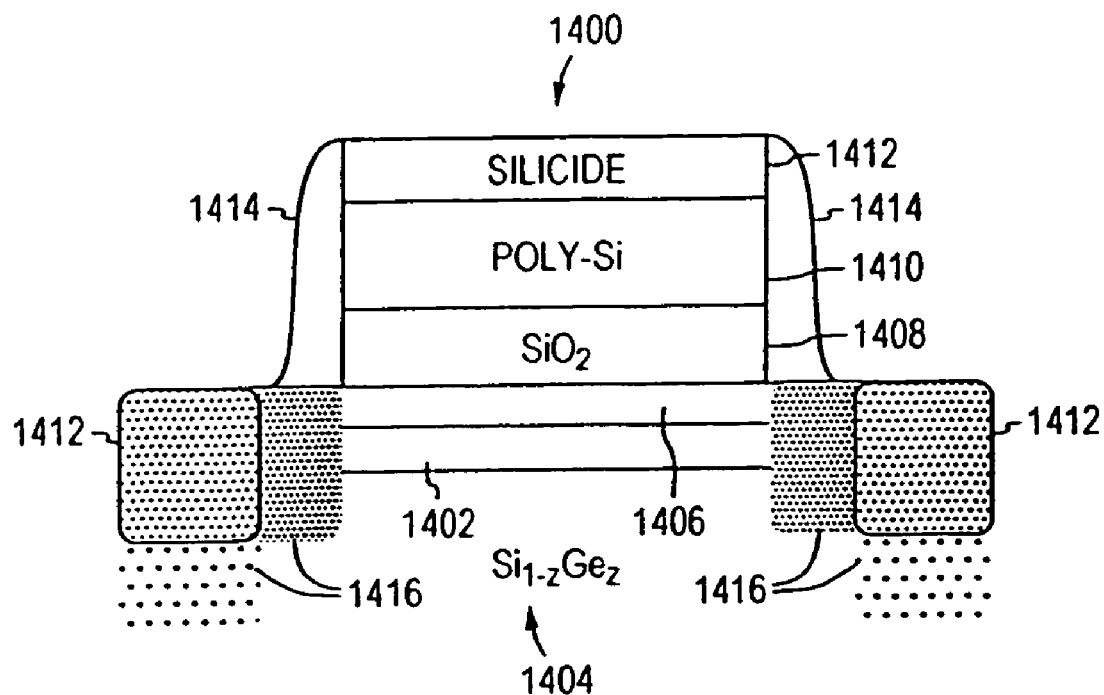
FIGS. 14A and 14B are schematic diagrams of surface and buried channel devices with $Si_{1-y}Ge_y$ channels on a relaxed $Si_{1-z}Ge_z$ layer.
Figure 14B:
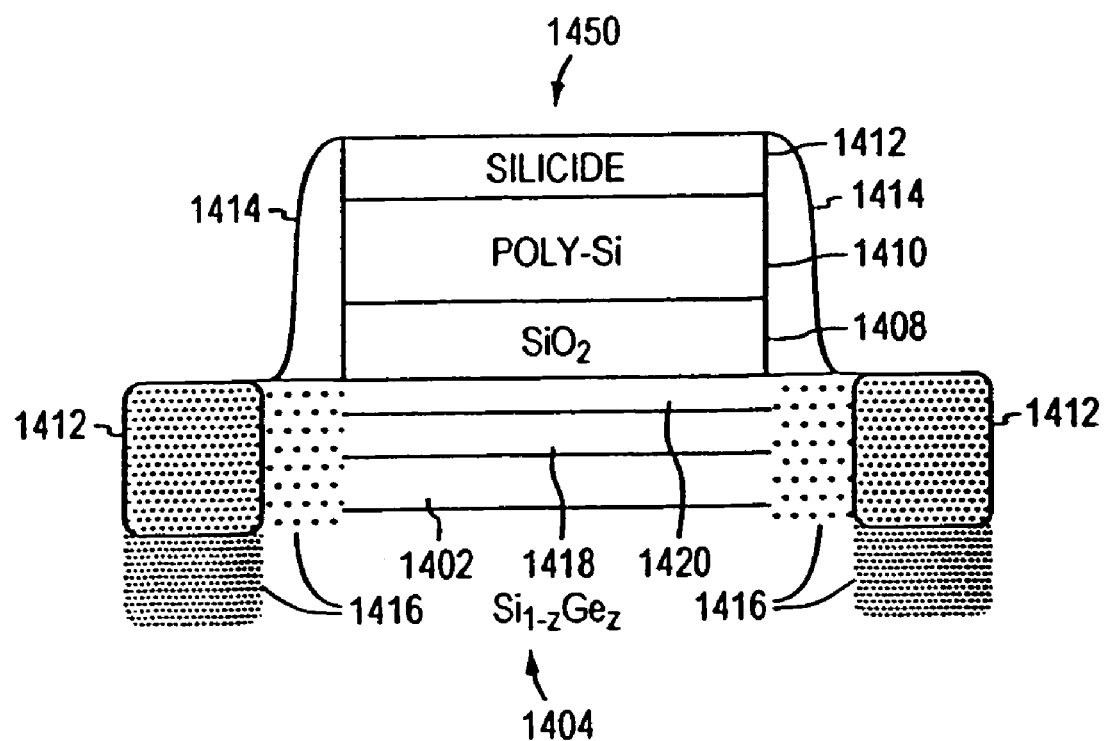

The combination of buried n-channel structures with n and p type surface channel MOSFETs has been emphasized heretofore. It is important to also emphasize that in buried n-channel devices as well as in surface channel devices, the channels need not be pure Si. $Si_{1-y}Ge_y$ channels can be used to increase the stability during processing. FIGS. 14A and 14B are schematic diagrams of surface 1400 and buried 1450 channel devices with $Si_{1-y}Ge_y$ channels 1402 on a relaxed $Si_{1-z}Ge_z$ layer 1404. The devices are shown after salicidation and thus contain a poly-Si gate 1410, gate oxide 1408, silicide regions 1412, spacers 1414, and doped regions 1416. In the surface channel device 1400, a thin layer 1406 of Si must be deposited onto the $Si_{1-y}Ge_y$ layer 1402 to form the gate oxide 1408, as previously described for buried channel devices. In the buried $Si_{1-y}Ge_y$ channel device 1450, the device layer sequence is unchanged and consists of a buried strained channel 1402, a SiGe spacer layer 1418, and a surface Si layer 1420 for oxidation.

To maintain tensile strain in the channel of an NMOS device, the lattice constant of the channel layer must be less than that of the relaxed SiGe layer, i.e., y must be less than z. Since n-channel devices are sensitive to alloy scattering, the highest mobilities result when the Ge concentration in the channel is low. In order to have strain on this channel layer at a reasonable critical thickness, the underlying SiGe should have a Ge concentration in the range of 10–50%.

Experimental data indicates that p channels are less sensitive to alloy scattering. Thus, surface MOSFETs with alloy channels are also possible. In addition, the buried channel devices can be p-channel devices simply by having the Ge concentration in the channel, y, greater than the Ge concentration in the relaxed SiGe alloy, z, and by switching the supply dopant from n-type to p-type. This configuration can be used to form Ge channel devices when y=1 and 0.5<z<0.9.

With the ability to mix enhancement mode surface channel devices (n and p channel, through implants as in typical Si CMOS technology) and depletion-mode buried channel MOSFETs and MODFETs, it is possible to create highly integrated digital/analog systems. The enhancement mode devices can be fabricated into high performance CMOS, and the regions of an analog circuit requiring the high performance low-noise depletion mode device can be fabricated in the buried channel regions. Thus, it is possible to construct optimal communication stages, digital processing stages, etc. on a single platform. These different regions are connected electrically in the backend of the Si CMOS chip, just as transistors are connected by the back-end technology today. Thus, the only changes to the CMOS process are some parameters in the processes in the fabrication facility, and the new material, but otherwise, the entire manufacturing process is transparent to the change. Thus, the economics favor such a platform for integrated Si CMOS systems on chip.

Although the present invention has been shown and described with respect to several preferred embodiments thereof, various changes, omissions and additions to the form and detail thereof, may be made therein, without departing from the spirit and scope of the invention.

What is claimed is:

1. A method comprising:
    providing a substrate; and
    forming a FET by;
    forming a gate stack over the substrate, thereby defining a channel below the gate stack, and
    providing a strain-inducing material over at least a portion of the substrate,
    wherein the strain-inducing material induces a strain in the channel, the strained channel has an average surface roughness of no more than approximately 2 nm, and forming the FET comprises forming a metal suicide region.

2. The method of claim 1, wherein the strained channel comprises at least one of silicon and germanium.

3. The method of claim 1, wherein the strained channel is tensilely strained.

4. The method of claim 1, wherein the strained channel is compressively strained.

5. The method of claim 1, wherein the strained channel has a surface roughness of less than approximately 0.77 nm.

6. The method of claim 1, wherein the strain-inducing material comprises silicon.

7. The method of claim of claim 6, further comprising:
    forming a device isolation region for the FET.

8. The method of claim 7, wherein the device isolation region is proximate the strain-inducing material.

9. The method of claim 7, wherein the device isolation region is selected from the group consisting of an STI region and a LOCOS region.

10. The method of claim 1, wherein the strain-inducing material comprises germanium.

11. The method of claim of claim 10, further comprising:
    forming a device isolation region for the FET.

12. The method of claim 11, wherein the device isolation region is disposed proximate the strain-inducing material.

13. The method of claim 11, wherein the device isolation region is selected from the group consisting of an STI region and a LOCOS region.

14. The method of claim 1, wherein providing the substrate comprises providing an insulator layer, and the strained channel is defined over the insulator layer.

15. The method of claim 14, wherein the insulator layer comprises $SiO_2$.

16. The method of claim 14, wherein providing the insulator layer comprises wafer bonding.

17. The method of claim 1, wherein the strained channel is disposed over an insulator layer.

18. The method of claim 1, wherein the strained channel is disposed over a relaxed material.

19. The method of claim 1, wherein providing the strain-inducing material comprises epitaxial growth.

20. The method of claim 1, wherein the metal suicide region comprises an alloy of a metal and SiGe.

21. The method of claim 20, wherein the metal is selected from the group consisting of titanium, cobalt, and nickel.

22. The method of claim 1, wherein forming the metal silicide region comprises deposition and annealing.

23. The method of claim 1, wherein forming the FET comprises providing a source region and a drain region, and the metal silicide region is formed over at least one of the source and the drain regions.

24. The method of claim 23, further comprising:
    providing a layer comprising at least one of silicon and germanium in at least one of the source and the drain regions prior to forming the metal silicide region.

25. The method of claim 24, wherein the layer comprising at least one of silicon and germanium is substantially strained.

26. The method of claim 1, wherein the strained channel is disposed proximate a material comprising germanium.

27. The method of claim of claim 1, further comprising:
    forming a device isolation region for the FET.

28. The method of claim 27, wherein the device isolation region is formed proximate a material comprising germanium.

29. The method of claim 27, wherein the device isolation region is selected from the group consisting of an STI region and a LOCOS region.

30. A method comprising:
providing a substrate consisting essentially of one or more semiconductor materials; and forming a FET by:
forming a gate stack over the substrate, thereby defining a channel below the gate stack,
providing a strain-inducing material over at least a portion of the substrate,
providing a source region and a drain region, and
forming a metal silicide region over at least one of the source region and the drain region, the metal silicide region comprising an alloy of nickel and SiGe,
wherein (i) the strain-inducing material induces a strain in the channel, (ii) the strain-inducing material comprises SiGe, and is disposed in the source region and the drain region, and (iii) the strained channel has an average surface roughness of less than approximately 0.77 nm and consists essentially of silicon.

31. The method of claim 30, wherein the strain-inducing material consists essentially of SiGe.

32. The method of claim 30, wherein the substrate consists essentially of Si and Ge.

33. The method of claim 30, wherein the substrate consists essentially of Si.

34. The method of claim 29, wherein the strained channel is compressively strained.

* * * * *

UNITED STATES PATENT AND TRADEMARK OFFICE
CERTIFICATE OF CORRECTION

PATENT NO.       : 7,256,142 B2                                          Page 1 of 1
APPLICATION NO.  : 10/967998
DATED            : August 14, 2007
INVENTOR(S)      : Eugene A. Fitzgerald It is certified that error appears in the above-identified patent and that said Letters Patent is hereby corrected as shown below:

In Claim 1, Column 12, line 2, replace "suicide" with --silicide--

In Claim 20, Column 12, line 43, replace "suicide" with --silicide--

In Claim 29, Column 13, line 3, replace "LOGOS" with --LOCOS--

In Claim 34, Column 14, line 11, replace "claim 29," with --claim 30,--

Signed and Sealed this

Sixteenth Day of October, 2007

JON W. DUDAS
*Director of the United States Patent and Trademark Office*